(12) United States Patent
Han et al.

(10) Patent No.: US 12,289,970 B2
(45) Date of Patent: Apr. 29, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Tingliang Liu, Beijing (CN); Maoying Liao, Beijing (CN); Yi Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/771,067

(22) PCT Filed: Mar. 30, 2021

(86) PCT No.: PCT/CN2021/084089
§ 371 (c)(1),
(2) Date: Apr. 22, 2022

(87) PCT Pub. No.: WO2022/204977
PCT Pub. Date: Oct. 6, 2022

(65) Prior Publication Data
US 2024/0306441 A1    Sep. 12, 2024

(51) Int. Cl.
*H10K 59/131* (2023.01)
*G09G 3/3233* (2016.01)
*H10K 59/121* (2023.01)

(52) U.S. Cl.
CPC ......... *H10K 59/131* (2023.02); *G09G 3/3233* (2013.01); *H10K 59/1213* (2023.02);
(Continued)

(58) Field of Classification Search
CPC .. G09G 3/3266; G09G 3/3291; G09G 3/3233; G09G 2310/0278;
(Continued)

(56) References Cited

U.S. PATENT DOCUMENTS 10,629,130 B2 * 4/2020 Kim ..................... G09G 3/3266
10,991,788 B2    4/2021 Wonkyu et al.
(Continued)

FOREIGN PATENT DOCUMENTS

CN    107274829 A    10/2017
CN    107767817 A    3/2018
(Continued)

OTHER PUBLICATIONS

Written Opinion from PCT/CN2021/084089 dated Jan. 11, 2022.
International Search Report from PCT/CN2021/084089 Jan. 11, 2022.

*Primary Examiner* — Shaheda A Abdin
(74) *Attorney, Agent, or Firm* — Calfee, Halter & Griswold LLP

(57) ABSTRACT

A display panel includes a pixel-driving circuit, wherein the display panel further includes: a base substrate, a second conductive layer and a third conductive layer. The second conductive layer is located on one side of the base substrate. The second conductive layer includes a first initial signal line, and the first initial signal line is configured to provide the first initial signal to the pixel-driving circuit. The third conductive layer is located on a side of the second conductive layer distal to the base substrate, the third conductive layer includes a second initial signal line, and the second initial signal line is configured to provide a second initial signal to the pixel-driving circuit, wherein sheet resistance of the first conductive layer is greater than that of the second
(Continued)

conductive layer. The signal on the second initial signal line in the display panel has a smaller voltage drop.

19 Claims, 21 Drawing Sheets

(52) U.S. Cl.
CPC .............. *G09G 2300/0819* (2013.01); *G09G 2300/0842* (2013.01); *G09G 2310/08* (2013.01); *G09G 2320/0223* (2013.01); *G09G 2320/0233* (2013.01)

(58) Field of Classification Search
CPC ... G09G 2320/0233; G09G 2300/0852; G09G 2310/061; H01K 59/1216; H01K 59/1213; H01K 59/131; H01K 59/1201
See application file for complete search history.

(56) References Cited

U.S. PATENT DOCUMENTS

| | | | |
|---|---|---|---|
| 2009/0140638 A1* | 6/2009 | Asano | ............... H10K 59/1315 313/504 |
| 2013/0141349 A1 | 6/2013 | Yoomee et al. | |
| 2018/0061424 A1 | 3/2018 | Lachapelle et al. | |
| 2020/0044009 A1* | 2/2020 | Kwak | .................. G09G 3/3233 |
| 2021/0193778 A1 | 6/2021 | Wang et al. | |
| 2022/0310751 A1* | 9/2022 | Shang | ................. H01L 27/1222 |

FOREIGN PATENT DOCUMENTS

| | | |
|---|---|---|
| CN | 109686758 A | 4/2019 |
| CN | 109786434 A | 5/2019 |
| CN | 110190103 A | 8/2019 |
| CN | 110335565 A | 10/2019 |
| CN | 110544715 A | 12/2019 |
| CN | 110707139 A | 1/2020 |
| CN | 110808265 A | 2/2020 |
| CN | 210516730 U | 5/2020 |
| CN | 111429842 A | 7/2020 |
| CN | 211265478 U | 8/2020 |
| CN | 111613180 A | 9/2020 |
| CN | 111696486 A | 9/2020 |
| EP | 3288016 A1 | 2/2019 |

* cited by examiner

DISPLAY PANEL AND DISPLAY DEVICE

RELATED APPLICATIONS

This application is the National Stage entry of and claims priority to PCT/CN2021/084089, filed on Mar. 30, 2021, titled DISPLAY PANEL AND DISPLAY DEVICE, the entire disclosure of which is incorporated herein by reference.

TECHNICAL FIELD

The present disclosure relates to the field of display technology, and in particular, to a display panel and a display device.

BACKGROUND

A display panel usually includes initial signal lines and pixel-driving circuits, and the initial signal lines are configured to provide initial signals to the pixel-driving circuits. In the related art, the initial signal lines are generally located in a gate layer of the display panel. However, due to large sheet resistance of the gate layer, the initial signals on the initial signal lines have large voltage drops during transmission.

It should be noted that the information disclosed in the above background is only for enhancing understanding of the background of the present disclosure, and therefore may include information that does not form the prior art known to a person of ordinary skill in the art.

SUMMARY

According to one aspect of the present disclosure, there is provided a display panel, including pixel-driving circuits, wherein the display panel further includes a base substrate, a second conductive layer and a third conductive layer, the second conductive layer is located on a side of the base substrate, wherein the second conductive layer includes first initial signal lines, and the first initial signal lines are configured to provide first initial signals to the pixel-driving circuits; and the third conductive layer, located on a side of the second conductive layer distal to the base substrate, wherein the third conductive layer includes second initial signal lines, and the second initial signal lines are configured to provide second initial signals to the pixel-driving circuits; wherein, sheet resistance of a first conductive layer is greater than sheet resistance of the second conductive layer.

In an exemplary embodiment of the present disclosure, the second conductive layer includes a molybdenum layer. The third conductive layer includes a first titanium layer, an aluminum layer and a second titanium layer, wherein the first titanium layer is located on a side of the first conductive layer distal to the base substrate, the aluminum layer is located on a side of the first titanium layer distal to the base substrate, and the second titanium layer is located at a side of the aluminum layer distal to the base substrate.

In an exemplary embodiment of the present disclosure, an orthographic projection of at least a part of structure of the first initial signal line on the base substrate extends along a first direction; an orthographic projection of at least a part of the second initial signal line on the base substrate extends along a second direction, and the first direction and the second direction intersect; the first initial signal line is configured to provide the first initial signal to a plurality of pixel-driving circuits distributed along the first direction; and the second initial signal line is configured to provide the second initial signal to the plurality of pixel-driving circuits distributed along the second direction.

In an exemplary embodiment of the present disclosure, the third conductive layer further includes a power supply line, wherein an orthographic projection of the power supply line on the base substrate extends along the second direction.

In an exemplary embodiment of the present disclosure, the pixel-driving circuit is configured to drive a light-emitting unit to emit light, the pixel-driving circuit includes a driving transistor, a first transistor and a seventh transistor, the first transistor has a second end configured to receive the second initial signal and the second end is connected to a gate end of the driving transistor, and the seventh transistor has a first end configured to receive the first initial signal and a second end configured to connect an anode of the light-emitting unit.

In an exemplary embodiment of the present disclosure, the pixel-driving circuit is configured to drive a light-emitting unit to emit light, the pixel-driving circuit includes a driving transistor, a first transistor and a seventh transistor, the first transistor has a second end configured to receive the first initial signal and the second end is connected to a gate end of the driving transistor, and the seventh transistor has a first end configured to receive the second initial signal and a second end configured to connect an anode of the light-emitting unit.

In an exemplary embodiment of the present disclosure, the pixel-driving circuit includes a plurality of transistors, the display panel further includes an active layer, the active layer is located between the base substrate and the second conductive layer, a part of the active layer is configured to form channel regions of the transistors, and the active layer includes: a first active part group, comprising a plurality of first active parts, wherein orthographic projections of the plurality of first active parts on the base substrate are distributed at intervals in the second direction, and orthographic projection of a part of the first active part on the base substrate extends along the second direction; and the second initial signal line includes: a plurality of first extending parts, arranged in a one-to-one correspondence with the first active parts, wherein any segment of orthographic projection of the first extending part on the base substrate along an extending direction of the first extending part at least partially overlaps with an orthographic projection of the first active part corresponding to the first extending part on the base substrate.

In an exemplary embodiment of the present disclosure, the pixel-driving circuit further includes a second transistor and a sixth transistor; the second transistor has a first end connected to the gate end of the driving transistor, a second end connected to a first end of the driving transistor, and a gate end connected to the gate-driving signal end; the sixth transistor has a first end connected to the first end of the driving transistor, a second end connected to the anode of the light-emitting unit, and a gate end connected to an enable signal end; and the first active part includes: a first sub-active part, wherein an orthographic projection of the first sub-active part on the base substrate extends along the first direction, and a part of the first sub-active part is configured to form a first channel region of the second transistor; and a second sub-active part, connected to the first sub-active part, wherein an orthographic projection of at least a part of the second sub-active part on the base substrate extends along the second direction, and a part of the second sub-active parts are configured to form a second channel region of the second transistor, and channel regions of the sixth transistor and the seventh transistor; wherein, in the same first active part group, orthographic projections of the plurality of first sub-active parts on the base substrate and orthographic projections of a plurality of the second sub-active parts on the base substrate are alternately distributed in sequence in the second direction.

In an exemplary embodiment of the present disclosure, the display panel further includes a first conductive layer, the first conductive layer is located between the active layer and the second conductive layer, and the first conductive layer includes: a first conductive part, wherein an orthographic projection of the first conductive part on the base substrate intersects with the orthographic projection of the first sub-active part on the base substrate, and a part of structure of the first conductive part is configured to form a first gate end of the second transistor; wherein the first conductive part includes a first sub-conductive part, and in the second direction, an orthographic projection of the first sub-conductive part on the base substrate is located between orthographic projections of two adjacent first active parts in the same first active part group on the base substrate; and the second initial signal line further includes: a plurality of first connecting parts, wherein the first connecting part is connected between two adjacent first extending lines, and an orthographic projection of the first connecting part on the base substrate and the orthographic projection of the first sub-conductive part on the base substrate at least partially overlap.

In an exemplary embodiment of the present disclosure, a number of the second initial signal lines is plural, and the second conductive layer further includes: a plurality of third initial signal lines, configured to provide the second initial signal to the pixel-driving circuits, and orthographic projections of the plurality of third initial signal lines on the base substrate extend along the first direction and are distributed at intervals along the second direction; wherein at least a part of the third initial signal line is connected to at least a part of the second initial signal line through via holes.

In an exemplary embodiment of the present disclosure, the respective second initial signal lines are connected to the respective third initial signal lines through via holes, respectively.

In an exemplary embodiment of the present disclosure, the first sub-active part includes: a first sub-sub-active part, configured to form a first channel region of the first transistor; the second sub-active part includes: a second sub-sub-active part, configured to form a second channel region of the second transistor; the first active part further includes: a third sub-active part, connected between the first sub-sub-active part and the second sub-sub-active part, and the third sub-active part is formed by a part of the first sub-active part and a part of the second sub-active par; and the second conductive layer further includes: a second conductive part, connected to the power supply line, wherein an orthographic projection of the second conductive part on the base substrate and n orthographic projection of the third sub-active part on the base substrate at least partially overlap.

In an exemplary embodiment of the present disclosure, a plurality of the pixel-driving circuits include a first pixel-driving circuit and a second pixel-driving circuit adjacent in the first direction; the first conductive layer includes: a third conductive part, configured to form the gate end of the driving transistor; the active layer further includes: a second active part, connected to an end of the first sub-sub-active part that is distal to the second sub-sub-active part in the same first active part, wherein the second active part is electrically connected to the third conductive part; and the second conductive part includes: a second sub-conductive part, wherein an orthographic projection of the second sub-conductive part on the base substrate at least partially overlaps with the orthographic projection of the third sub-active part in the first pixel-driving circuit on the base substrate; and a third sub-conductive part, connected to the second sub-conductive part, wherein an orthographic projection of the third sub-conductive part on the base substrate at least partially overlaps with an orthographic projection of the second active part in the second pixel-driving circuit on the base substrate.

In an exemplary embodiment of the present disclosure, the first conductive layer further includes: a first gate line, wherein an orthographic projection of the first gate line on the base substrate extends along the first direction, the orthographic projection of the first gate line on the base substrate and the orthographic projection of the second sub-active part on the base substrate intersects, at least a part of the first gate line is configured to form a second gate end of the second transistor, and the second gate line is connected to the first conductive part; and a second gate line, wherein an orthographic projection of the second gate line on the base substrate extends along the first direction, the orthographic projection of the second gate line on the base substrate and the orthographic projection of the second sub-active part on the base substrate intersects, and at least a part of the second gate line is configured to form a gate end of the sixth transistor; wherein an orthographic projection of the third conductive part on the base substrate is located between the orthographic projection of the first gate line on the base substrate and the orthographic projection of the second gate line on the base substrate.

In an exemplary embodiment of the present disclosure, the first gate line includes: a plurality of second extending parts; and a plurality of third extending parts, wherein the plurality of second extending parts and the plurality of the third extending parts are alternately connected in sequence in the first direction; wherein, an orthographic projection of at least a part of the second extending part on the base substrate is disposed in opposite to the orthographic projection of the third conductive part on the base substrate in the second direction, and a distance between the orthographic projection of the second extending part on the base substrate and the orthographic projection of the third conductive part on the base substrate in the second direction is greater than a distance between an orthographic projection of the third extending part on the base substrate and the orthographic projection of the third conductive part on the base substrate in the second direction.

In an exemplary embodiment of the present disclosure, the second gate line includes: a plurality of fourth extending parts; and a plurality of fifth extending parts, wherein the plurality of fourth extending parts and the plurality of the fifth extending parts are alternately connected in sequence in the first direction; wherein, an orthographic projection of at least a part of the fourth extending part on the base substrate is disposed in opposite to an orthographic projection of the third conductive part on the base substrate in the second direction, and a distance between the orthographic projection of the fourth extending part on the base substrate and the orthographic projection of the third conductive part on the base substrate in the second direction is greater than a distance between an orthographic projection of the fifth extending part on the base substrate and the orthographic projection of the third conductive part on the base substrate in the second direction.

In an exemplary embodiment of the present disclosure, the power supply line includes: a sixth extending part, wherein an orthographic projection of the sixth extending part on the base substrate at least partially overlaps with the orthographic projection of the third sub-conductive part on the base substrate, and the sixth extending part is connected to the third sub-conductive part through a via hole; and a seventh extending part, connected to the sixth extending part, wherein an orthographic projection of the seventh extending part on the base substrate intersects with the orthographic projection of the first gate line on the base substrate, and a size of the orthographic projection of the sixth extending part on the base substrate in the first direction is larger than a size of the orthographic projection of the seventh extending part on the base substrate in the first direction.

In an exemplary embodiment of the present disclosure, the first conductive layer further includes: a third gate line, wherein an orthographic projection of the third gate line on the base substrate extends along the first direction, the orthographic projection of the third gate line on the base substrate is located on a side of the orthographic projection of the first gate line on the base substrate distal to the orthographic projection of the third conductive part on the base substrate, and a part of the third gate line is configured to form the gate end of the first transistor; and the power supply line further includes: an eighth extending part, connected to an end of the sixth extending part distal to the seventh extending part, wherein an orthographic projection of the eighth extending part on the base substrate intersects with the orthographic projection of the third gate line on the base substrate, and a size of the orthographic projection of the eighth extending part on the base substrate in the first direction is less than a size of the orthographic projection of the sixth extending part on the base substrate in the first direction.

In an exemplary embodiment of the present disclosure, the third conductive layer further includes: a first convex part, connected to the power supply line, wherein an orthographic projection of the first convex part on the base substrate at least partially overlaps with the orthographic projection of the third conductive part on the base substrate; wherein the first convex part includes a first side, the power supply line includes a second side connected to the first side, and an angle between an orthographic projection of the first side on the base substrate and an orthographic projection of the second side on the base substrate may be less than 180°.

In an exemplary embodiment of the present disclosure, the second direction is a column direction, a number of the second initial signal lines is plural, and each column of pixel-driving circuits corresponds to one of the second initial signal lines According to an aspect of the present disclosure, there is provided a display device, including: the above-mentioned display panel.

It is to be understood that the foregoing general description and the following detailed description are exemplary and explanatory only and are not limiting of the present disclosure.

BRIEF DESCRIPTION OF THE DRAWINGS

The accompanying drawings, which are incorporated in and constitute a part of this specification, illustrate embodiments consistent with the disclosure and together with the specification serve to explain the principles of the disclosure. Apparently, the drawings in the following description are only some embodiments of the present disclosure, and for those of ordinary skill in the art, other drawings may be obtained from these drawings without creative efforts as well.

DETAILED DESCRIPTION

Figure 1:
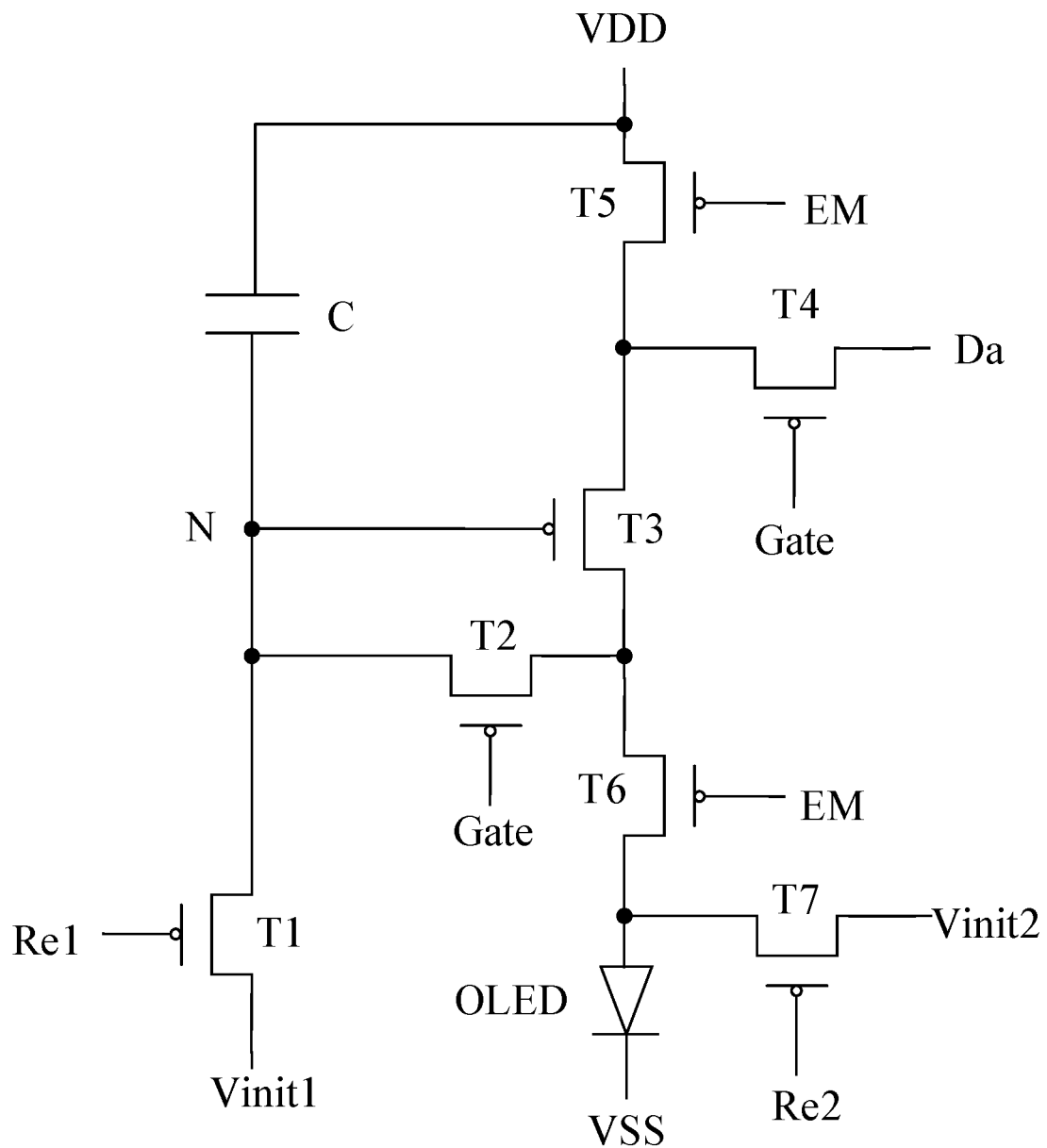
FIG. 1 is a schematic diagram of a circuit structure of a pixel-driving circuit in an exemplary embodiment of a display panel of the present disclosure.

Example embodiments will now be described more fully with reference to the accompanying drawings. Example embodiments, however, may be embodied in various forms and should not be construed as limited to examples set forth herein; rather, these embodiments are provided so that this disclosure will be thorough and complete, and will fully convey the concept of example embodiments to those skilled in the art. The same reference signs in the drawings denote the same or similar structures, and thus their detailed descriptions will be omitted.

Although relative terms such as "upper" and "lower" are used in this specification to describe a relative relationship of one component to another component marked in the drawings, these terms are used in this specification only for convenience, for example, a direction according to an example described in the drawings. It will be appreciated that if the device marked in the drawings is turned upside down, the component described as "upper" will become a component "lower". Other relative terms, such as "high", "low", "top", "bottom", "left" and "right", are used to have similar meanings as well. When a certain structure is "on" other structures, it may mean that the certain structure is integrally formed on the said other structures, or that the certain structure is "directly" arranged on the said other structures, or that the certain structure is "indirectly" arranged on the said other structures through another structure.

The terms "a", "an", "the" are used to indicate the presence of one or more elements/components/etc.; and the terms "including" and "having" are used to indicate an open-ended inclusive meaning and refer to that additional elements/components/etc. may be present in addition to the listed elements/components/etc.

As shown in FIG. 1, it is a schematic diagram of a circuit structure of a pixel-driving circuit in an exemplary embodiment of a display panel of the present disclosure. The pixel-driving circuit may include: a first transistor T1, a second transistor T2, a driving transistor T3, a fourth transistor T4, a fifth transistor T5, a sixth transistor T6, a seventh transistor T7 and a capacitor C. The first transistor T1 has a first end connected to a node N, a second end connected to a first initial signal end Vinit1, and a gate end connected to a reset signal end Re1. The second transistor T2 has a first end connected to a first end of the driving transistor T3, a second end connected to the node N, and a gate end connected to a gate-driving signal end Gate. The driving transistor T3 further has a gate end connected to the node N. The fourth transistor T4 has a first end connected to a data signal end Da, a second end connected to a second end of the driving transistor T3, and a gate end connected to the gate-driving signal end Gate. The fifth transistor T5 has a first end connected to a first power supply signal end VDD, a second end connected to the second end of the driving transistor T3, and a gate end connected to an enable signal end EM. The six transistors T6 has a first end connected to the first end of the driving transistor T3, and a gate end connected to the enable signal end EM. The seventh transistor T7 has a first end connected to a second initial signal end Vinit2, and a second end connected to a second end of the sixth transistor T6, and a gate end connected to a reset signal end Re2. The capacitor C is connected between the gate end of the driving transistor T3 and the first power signal end VDD. The pixel-driving circuit may be connected to a light-emitting unit OLED, for driving the light-emitting unit OLED to emit light, and the light-emitting unit OLED may be connected between the second end of the sixth transistor T6 and the second power end VSS. The transistors T1-T7 may all be P-type transistors.

Figure 2:
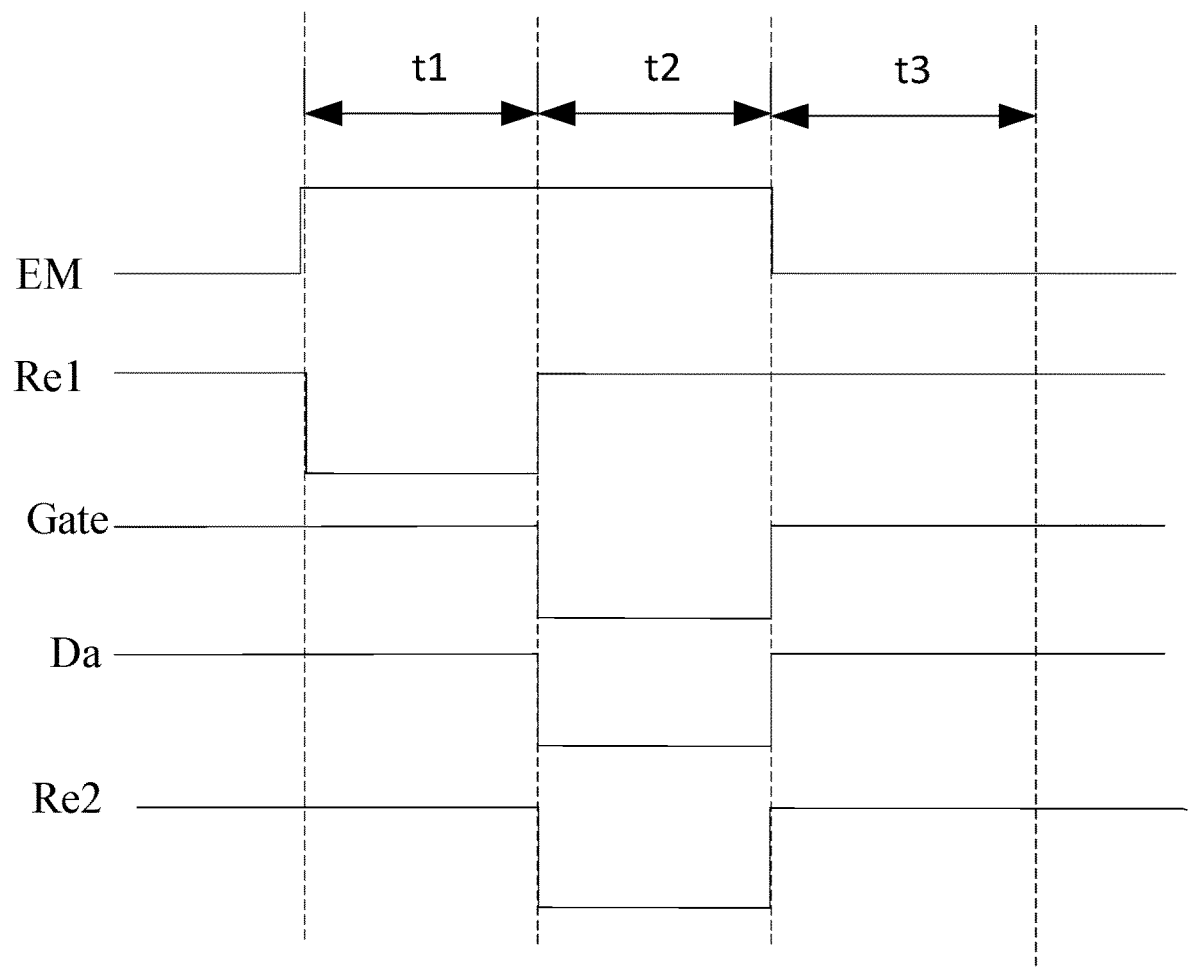
FIG. 2 is a timing diagram of respective nodes in a driving method of the pixel-driving circuit of FIG. 1.

As shown in FIG. 2, it is a timing diagram of respective nodes in a driving method of the pixel-driving circuit of FIG. 1. Gate represents a timing of the gate drive signal end Gate, Re1 represents a timing of the reset signal end Re1, Re2 represents a timing of the reset signal end Re2, EM represents a timing of the enable signal end EM, and Da represents a timing of the data signal end Da. The driving method of the pixel-driving circuit may include a reset phase t1, a compensation phase t2, and a light-emitting phase t3. In the reset phase t1: a low-level signal is input to the reset signal end Re1, the first transistor T1 is turned on, and the first initial signal end Vinit1 output an initial signal to the node N. In the compensation phase t2: a low-level signal is input to the reset signal end Re2 and the gate-driving signal end Gate, the fourth transistor T4, the second transistor T2 and the seventh transistor T7 are turned on, and the same time, a driving signal is input to the data signal end Da to write a voltage Vdata+Vth to the node N, where Vdata is a voltage of the driving signal, Vth is a threshold voltage of the driving transistor T3, and the second initial signal end Vinit2 inputs an initial signal to the second end of the sixth transistor T6. In the light-emitting phase t3: a low-level signal is input to the enable signal end EM, the sixth transistor T6 and the fifth transistor T5 are turned on, and the driving transistor T3 drives light emission under an action of the voltage Vdata+Vth stored in the capacitor C. According to a formula of output current of the driving transistor, $I=(\mu W C_{ox}/2L)(V_{gs}-V_{th})^2$, where u is carrier mobility, Cox is gate capacitance per unit area, W is a channel width of the driving transistor, and L is a channel length of the driving transistor, Vgs is a gate-source voltage difference of the driving transistor, and Vth is a threshold voltage of the driving transistor, an output current of the driving transistor T3 in the pixel drive circuit of the present disclosure, $I=(\mu W C_{ox}/2L)(V_{data}+V_{th}-V_{dd}-V_{th})^2$. The pixel-driving circuit can avoid influence of the threshold value of the driving transistor on its output current.

The pixel-driving circuit can respectively provide the first initial signal to the node N through the first initial signal end Vinit1, and provide the second initial signal to an electrode of the light-emitting unit through the second initial signal end Vinit2. Effective level voltages of the first initial signal and the second initial signal may not be equal. Therefore, the pixel-driving circuit may provide different initial signals to the node N and the electrode of the light-emitting unit according to actual requirements. For example, the effective level voltage of the first initial signal may be set to −3V, and the effective level voltage of the second initial signal may be set to −4V.

Figure 3:
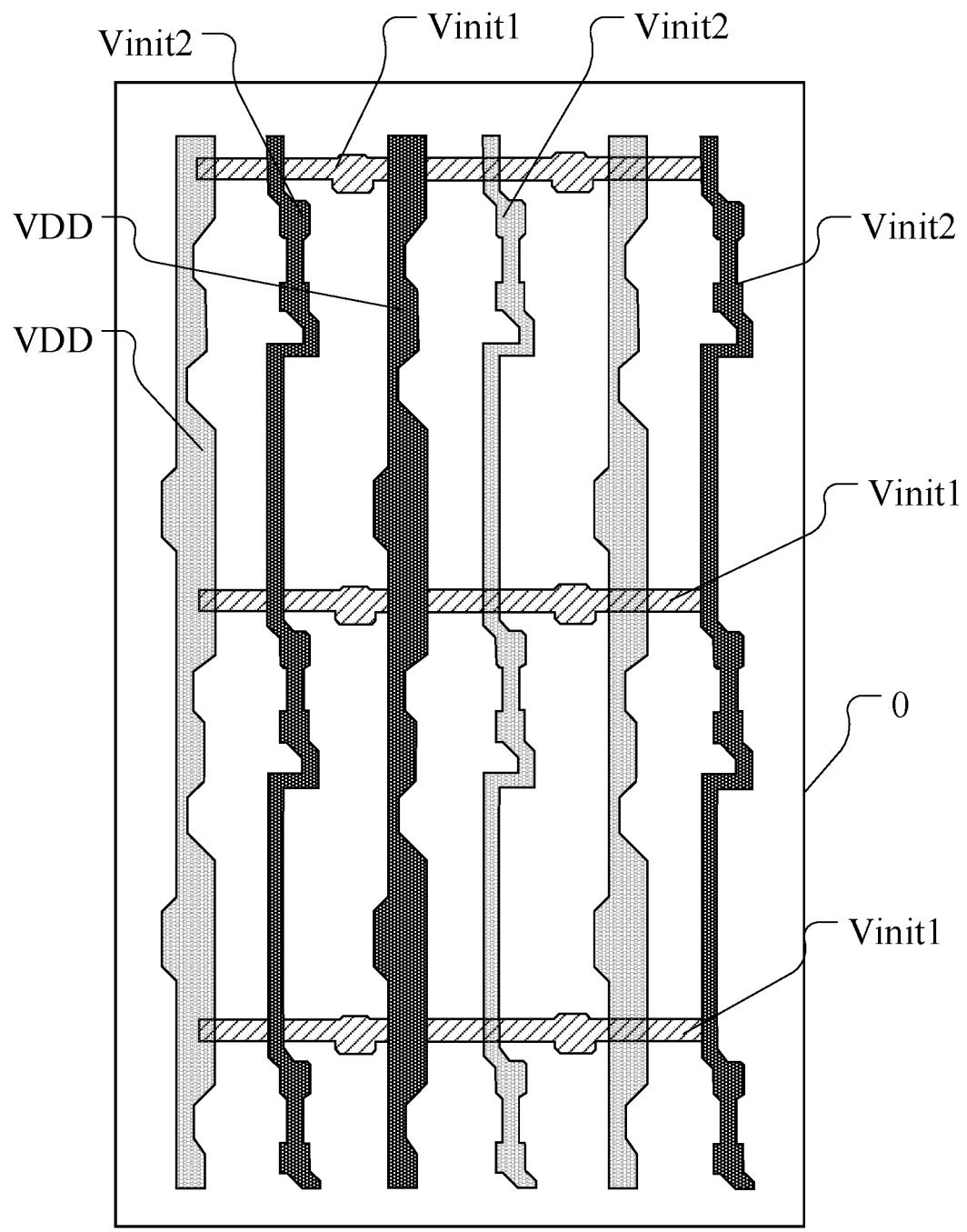
FIG. 3 is a structural layout of an exemplary embodiment of a display panel of the present disclosure.

The exemplary embodiment first provides a display panel, as shown in FIG. 3, it is a structural layout of an exemplary embodiment of the display panel of the present disclosure. The display panel may include a plurality of pixel-driving circuits, and a circuit diagram of each of the pixel-driving circuits may be shown in FIG. 1. The display panel may further include: a base substrate, a second conductive layer and a third conductive layer. The second conductive layer may be located on a side of the base substrate, the second conductive layer may include a first initial signal line Vinit1, and the first initial signal line Vinit1 may be configured to connect to the above first initial signal line end to provide the pixel-driving circuit with the first initial signal. A third conductive layer may be located on a side of the second conductive layer distal to the base substrate, the third conductive layer may include a second initial signal line Vinit2, and the second initial signal line Vinit2 may be configured to connect to the above second initial signal line end to provide the pixel-driving circuit with the second initial signal, wherein sheet resistance of the second conductive layer is greater than sheet resistance of the third conductive layer. The first initial signal line may provide an initial signal to the first initial signal end in the pixel-driving circuit, and the second initial signal line may provide an initial signal to the second initial signal end in the pixel-driving circuit.

In this exemplary embodiment, the second initial signal line Vinit2 is arranged in the third conductive layer with smaller sheet resistance, thereby reducing voltage drop of the second initial signal on the second initial signal line Vinit2 during transmission process, thus improving display uniformity of the display panel.

Figure 4:
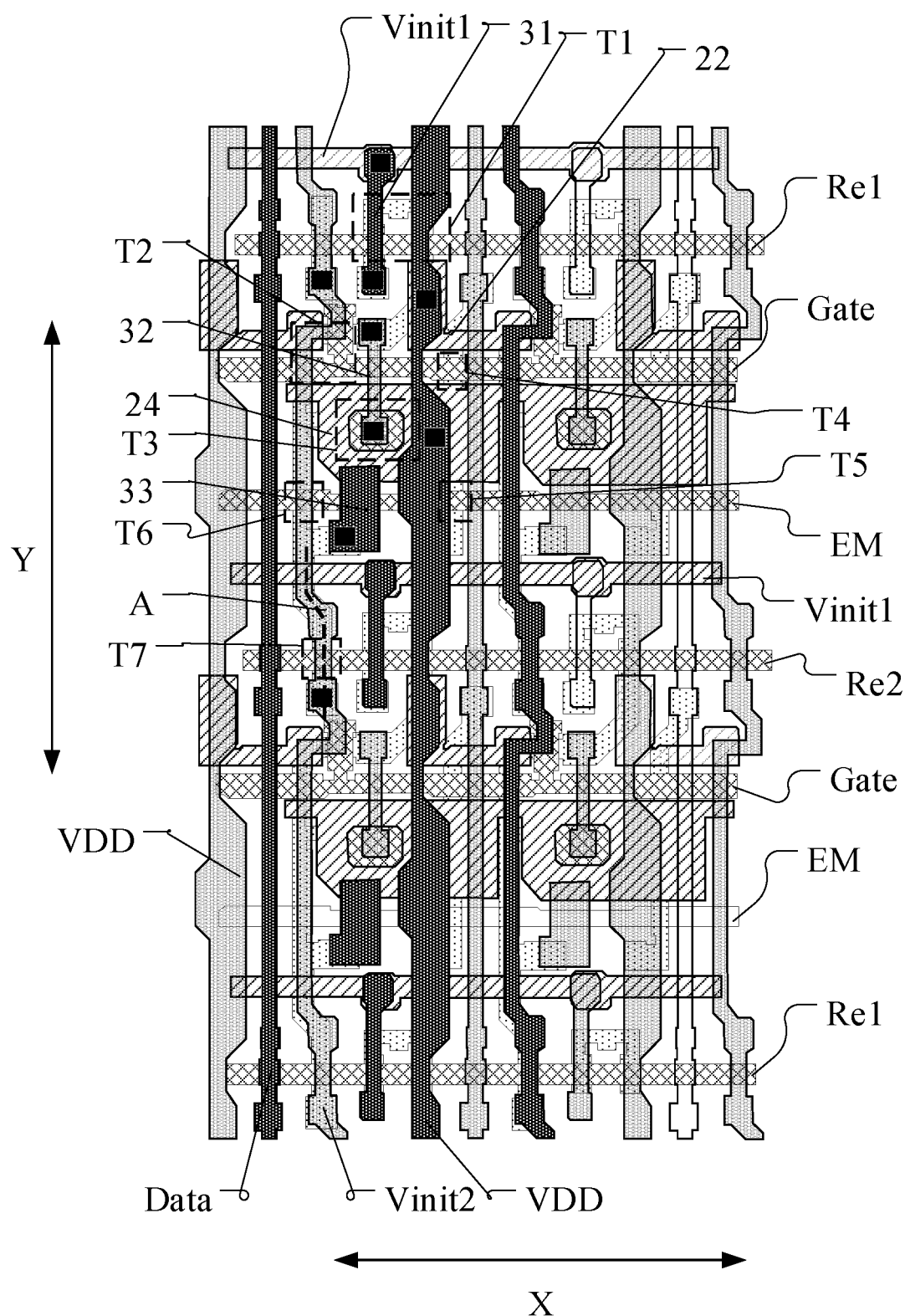
FIG. 4 is a structural layout of an exemplary embodiment of a display panel of the present disclosure.

In this exemplary embodiment, as shown in FIG. 1, the pixel-driving circuit may have a 7T1C structure. It should be understood that, in other exemplary embodiments, the pixel-driving circuit may have other structures, such as 8T1C and the like as well. As shown in FIG. 3, the second conductive layer may be located in the second gate layer of the display panel, that is, a part of structure of the second conductive layer may be configured to form an electrode of the capacitor C in the pixel-driving circuit of FIG. 1 as well. The third conductive layer may be located in a source-drain layer in the display panel, that is, a part of structure of the third conductive layer may be configured to form power supply lines or data lines as well. It should be understood that, in other exemplary embodiments, the second conductive layer and the third conductive layer may be located in other structural layers in the display panel as well. In addition, in other exemplary embodiments, the first initial signal line may provide an initial signal to the second initial signal end in the pixel-driving circuit as well, and the second initial signal line may provide an initial signal to the first initial signal end in the pixel-driving circuit as well. As shown in FIGS. 3 and 4, an orthographic projection of the first initial signal line Vinit1 on the base substrate may extend along a first direction X, an orthographic projection of at least a part of the second initial signal line Vinit2 on the base substrate may extend along a second direction Y, and the first direction X and the second direction Y may intersect, for example, the first direction may be a row direction, and the second direction may be a column direction. The second initial signal line Vinit2 may be configured to provide the second initial signal to a plurality of the pixel-driving circuits distributed along the second direction Y. It should be understood that, in other exemplary embodiments, the first initial signal line Vinit1 and the second initial signal line Vinit2 may have other extension structures as well, for example, the orthographic projections of the first initial signal line Vinit1 and the second initial signal line Vinit2 on the base substrate may extend in the same direction as well, and both the first initial signal line Vinit1 and the second initial signal line Vinit2 may be located in the third conductive layer and their orthographic projections on the base substrate may extend along the second direction Y.

In this exemplary embodiment, the second conductive layer may include a molybdenum layer. The third conductive layer may include a first titanium layer, an aluminum layer and a second titanium layer, the first titanium layer may be located on a side of the first conductive layer distal to the base substrate, the aluminum layer may be located on a side of the first titanium layer distal to the base substrate, and the second titanium layer may be located on a side of the aluminum layer distal to the base substrate.

The following exemplary embodiments will describe the display panel in detail with overall structures of the display panel.

Figure 5:
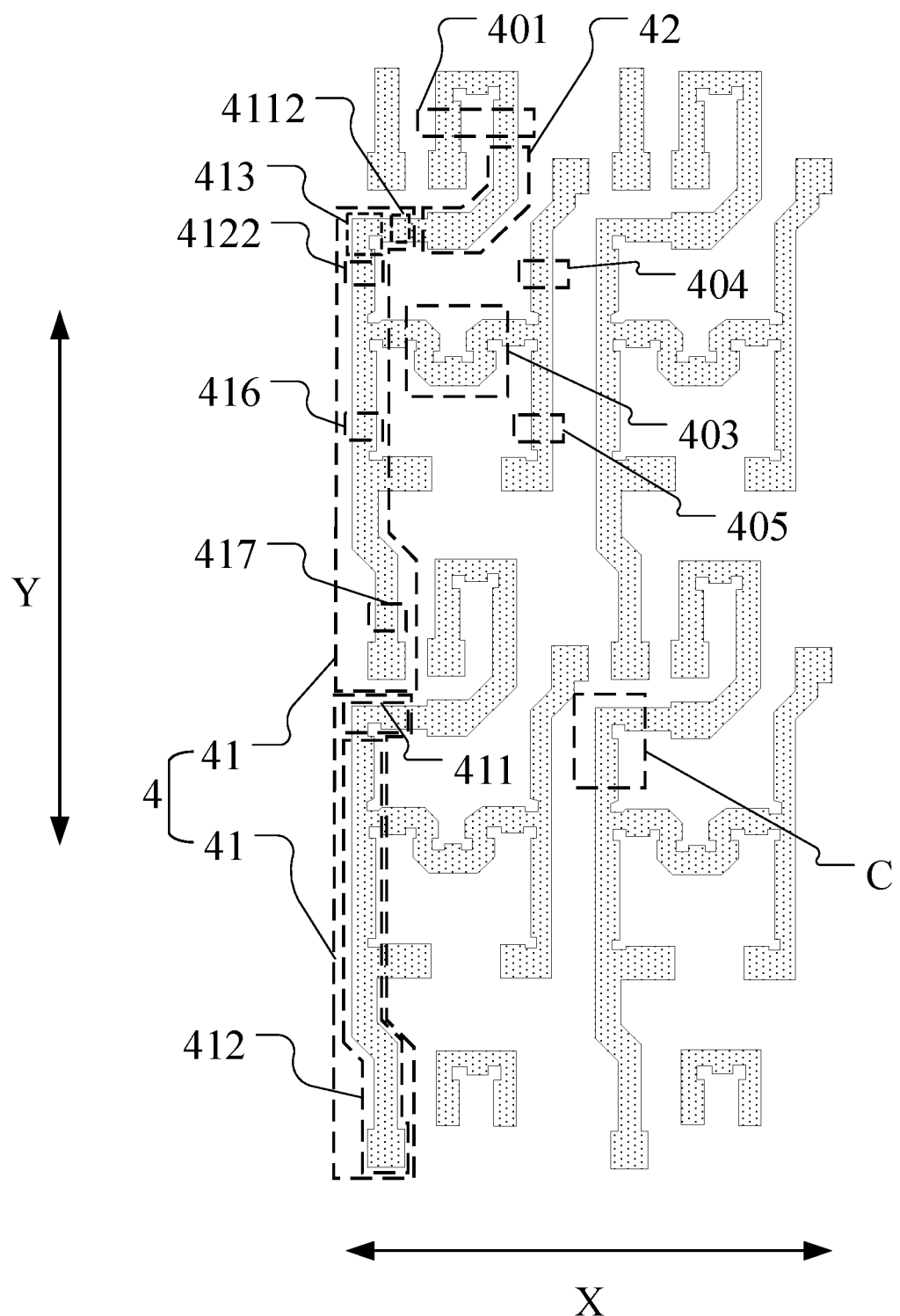
FIG. 5 is a structural layout of an active layer in FIG. 4.
Figure 6:
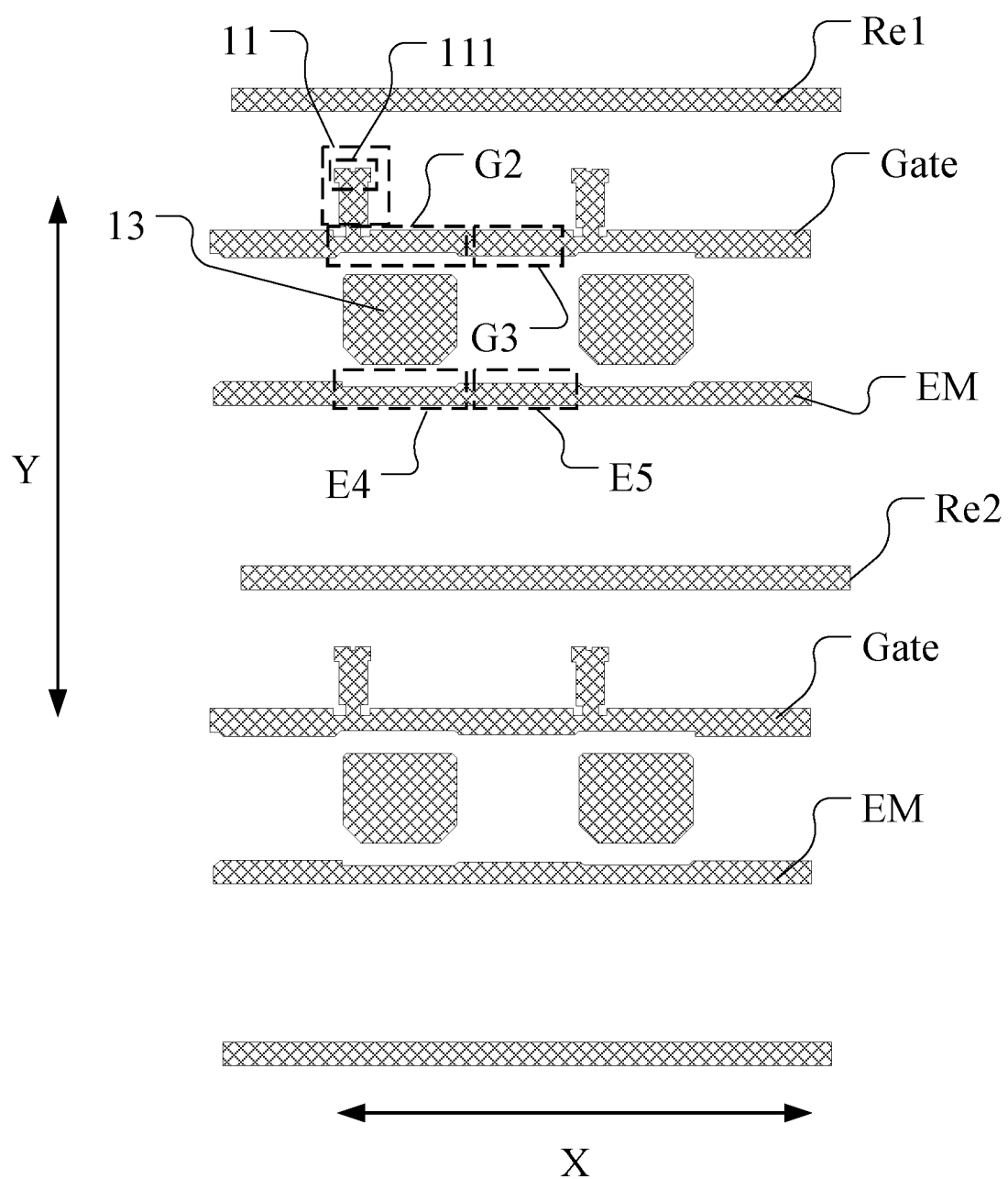
FIG. 6 is a structural layout of a first conductive layer in FIG. 4.
Figure 7:
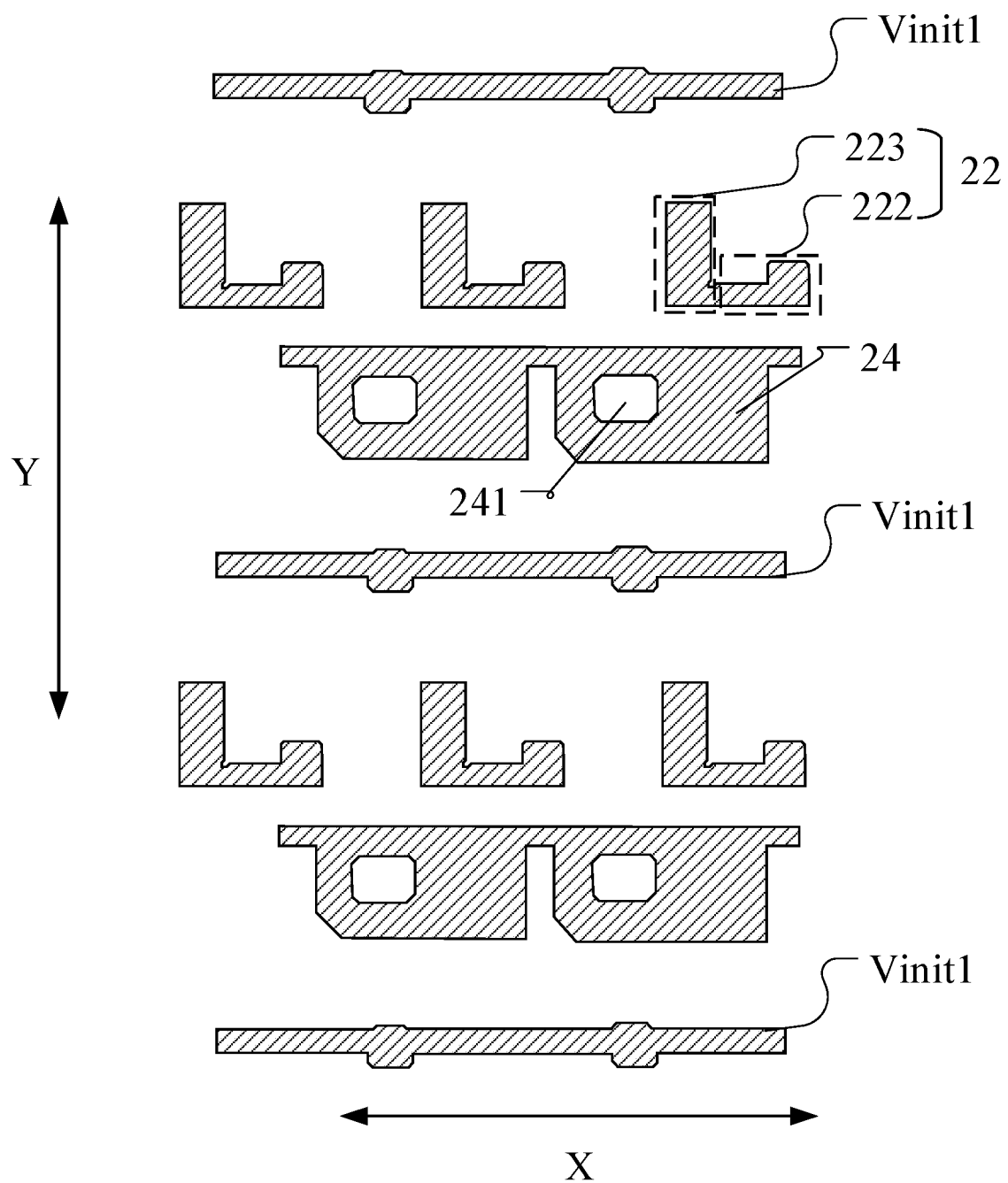
FIG. 7 is a structural layout of a second conductive layer in FIG. 4.
Figure 8:
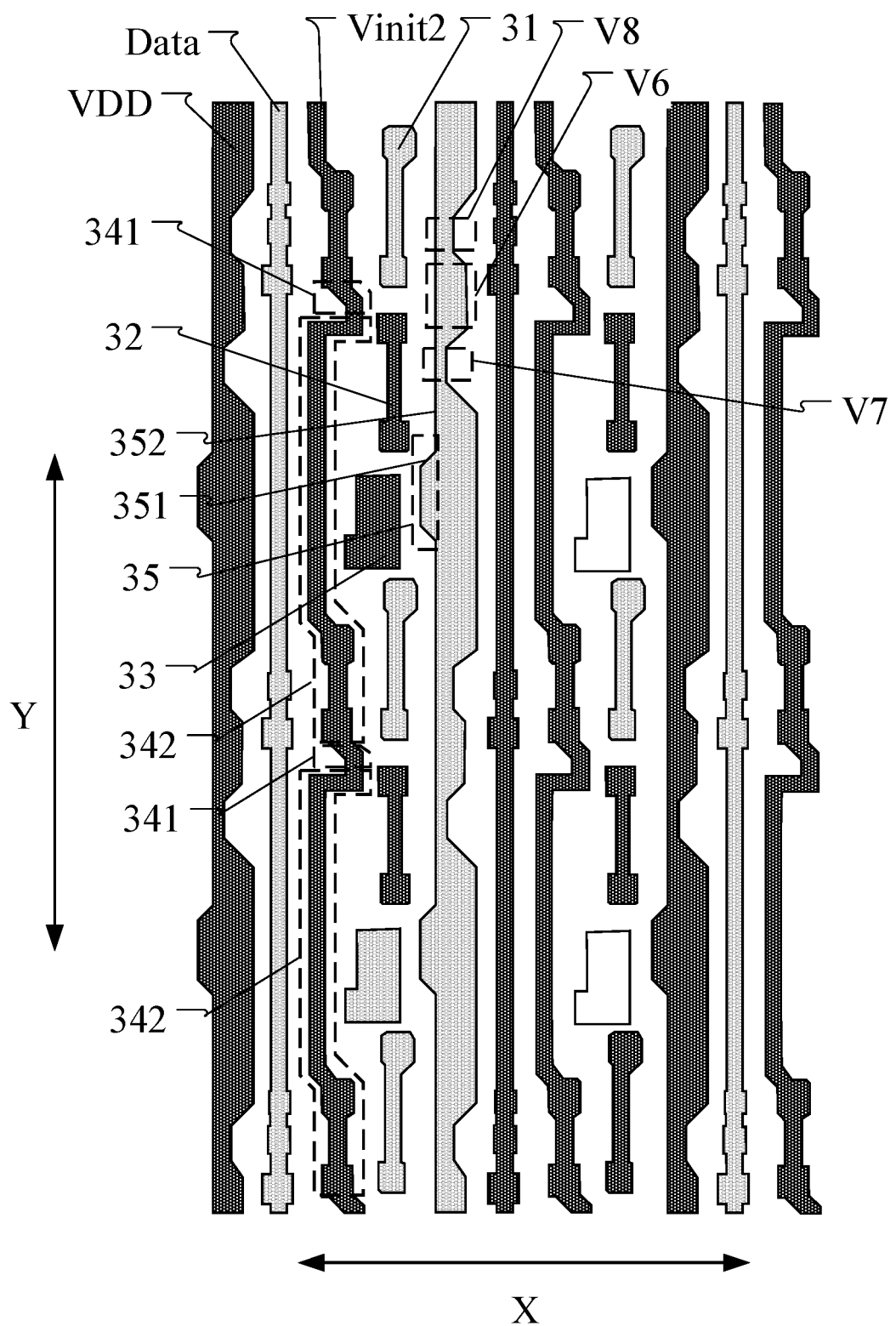
FIG. 8 is a structural layout of a source-drain layer in FIG. 4.
Figure 9:
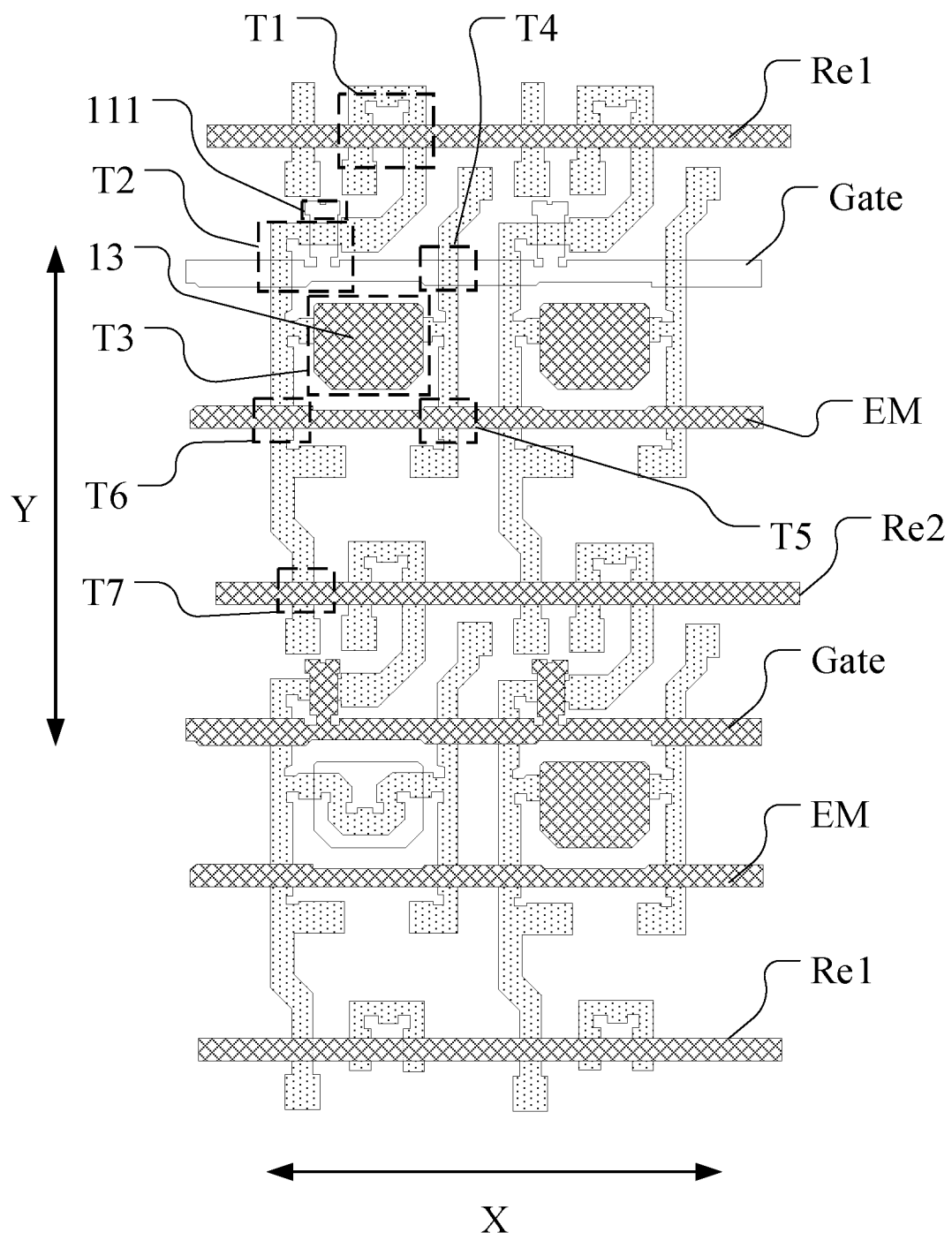
FIG. 9 is a structural layout of a stacking of the active layer and the first conductive layer in FIG. 4.
Figure 10:
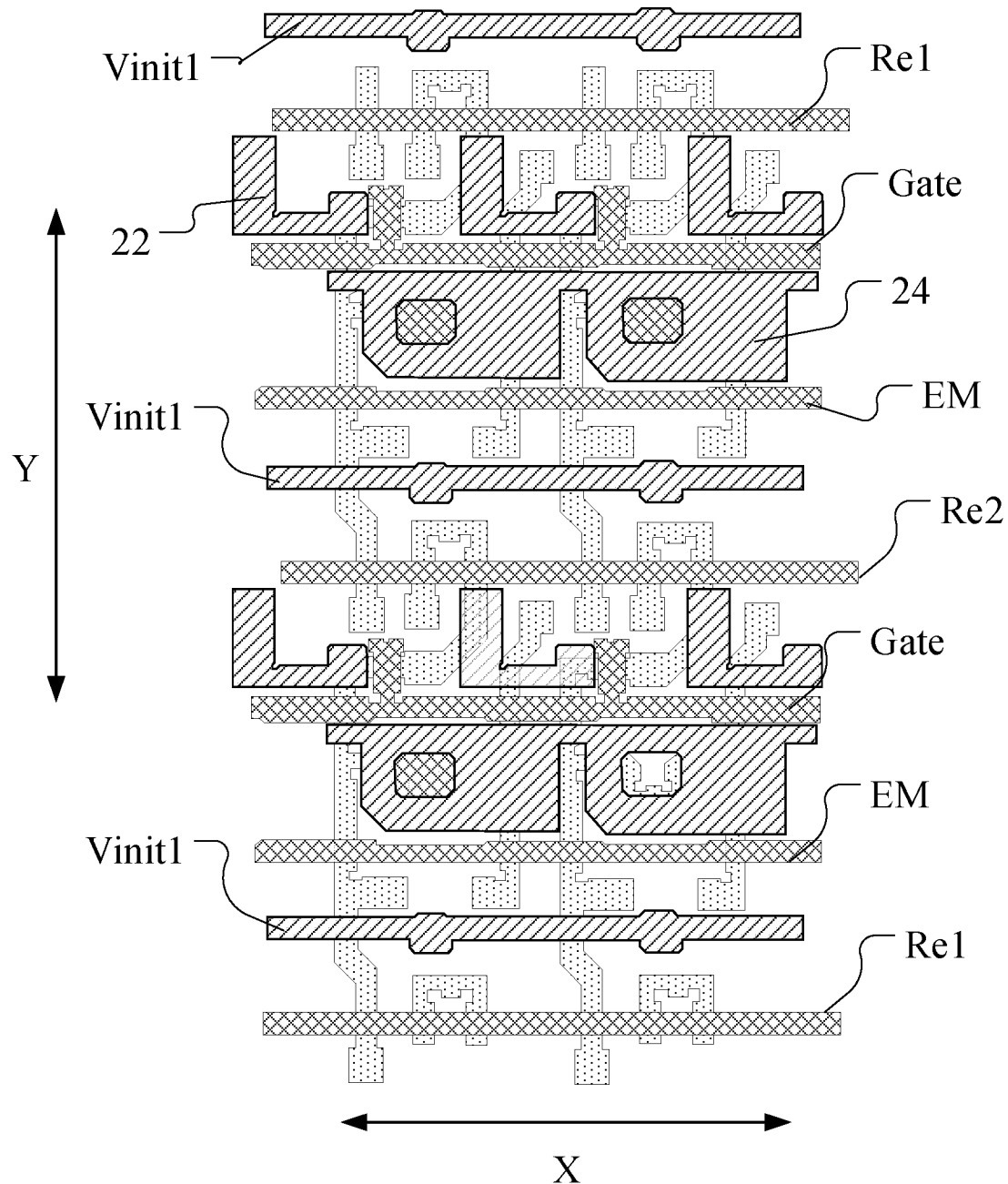
FIG. 10 is a structural layout of a stacking of the active layer, the first conductive layer and the second conductive layer in FIG. 4.

The display panel may further include the source-drain layer and a first conductive layer, and the base substrate, an active layer, the first conductive layer, the second conductive layer and the third conductive layer may be stacked in sequence. An insulating layer may be provided between any two adjacent layers of the above layers. As shown in FIGS. 4-10, FIG. 4 is a structural layout of an exemplary embodiment of the display panel of the present disclosure, FIG. 5 is a structural layout of the active layer in FIG. 4, FIG. 6 is a structural layout of the first conductive layer in FIG. 4, FIG. 7 is a structural layout of the second conductive layer in FIG. 4, FIG. 8 is a structural layout of the source-drain layer in FIG. 4, FIG. 9 is a structural layout of a stacking of the active layer and the first conductive layer in FIG. 4, and FIG. 10 is a structural layout of a stacking of the active layer, the first conductive layer and the second conductive layer in FIG. 4.

Figure 11:
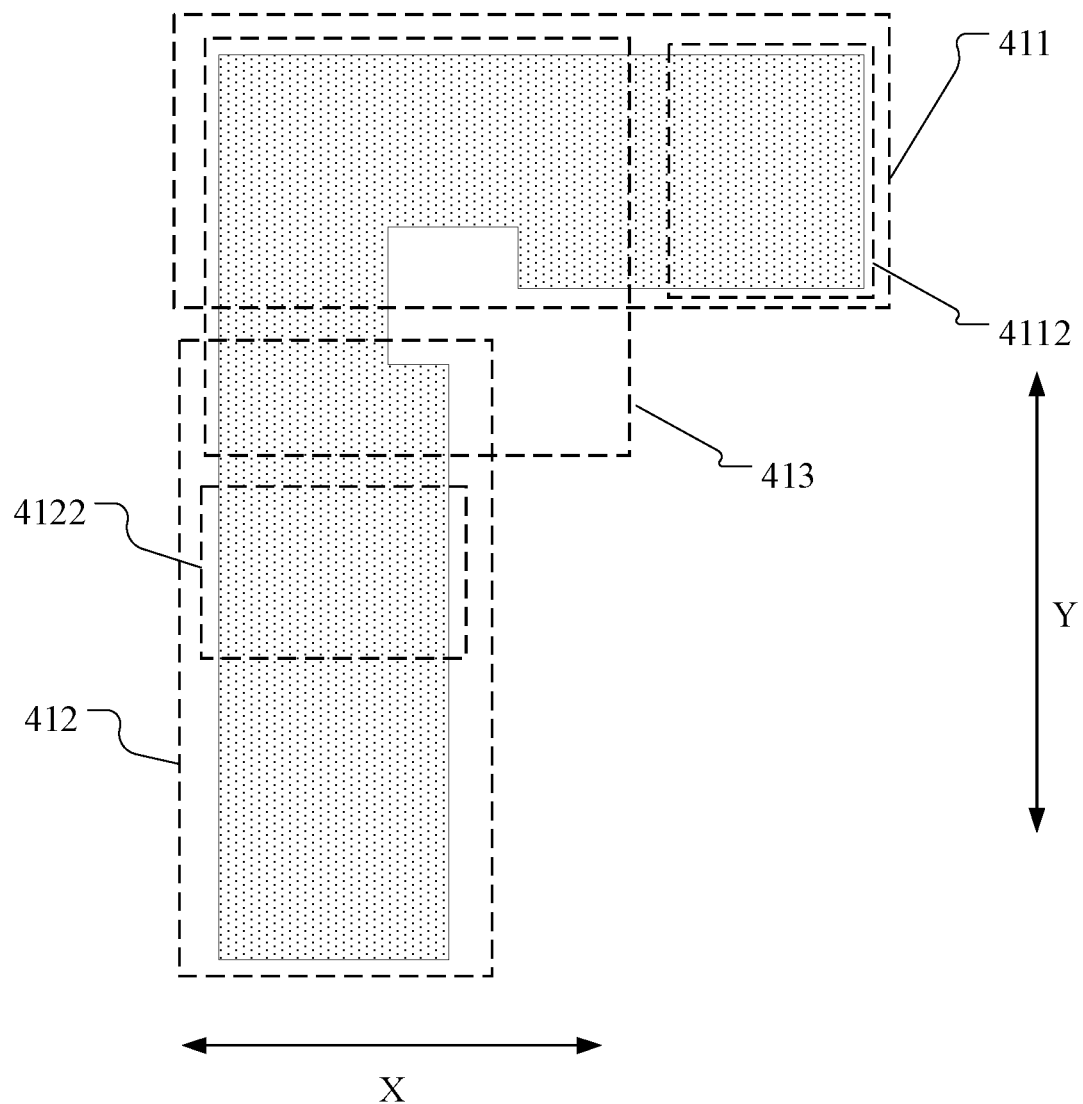
FIG. 11 is a partial enlarged view of region C in FIG. 5.

As shown in FIGS. 4, 5, 9 and 10, a part of structure of the active layer is configured to form channel regions of the transistors in the pixel-driving circuit. The active layer may include a first active part group 4 and a second active part 42, and the first active part group 4 may include a plurality of first active parts 41. Orthographic projections of the plurality of first active parts 41 on the base substrate may be distributed at intervals in the second direction Y, and an orthographic projection of at least a part of structure of each first active part 41 on the base substrate extends along the second direction Y. Each first active part 41 may include a first sub-active part 411 and a second sub-active part 412, an orthographic projection of the first sub-active part 411 on the base substrate may extend along the first direction X, the second sub-active part 412 is connected to the first sub-active part 411, and an orthographic projection of at least a part of structure of the second sub-active part 412 on the base substrate may extend along the second direction Y. In the same first active part group 4, orthographic projections of a plurality of the first sub-active parts 411 on the base substrate and orthographic projections of a plurality of the second sub-active parts 412 on the base substrate are alternately distributed in sequence in the second direction Y. As shown in FIG. 11, it is a partial enlarged view of region C in FIG. 5. The first sub-active part 411 may include a first sub-sub-active part 4112, and the second sub-active part 412 may include a second sub-sub-active part 4122, wherein the first sub-sub-active part 4112 may be configured to form a first channel region of the second transistor T2, and the second sub-sub-active part 4122 may be configured to form a second channel region of the second transistor T2. The active layer may further include a third sub-active part 413 connected between the first sub-sub-active part 4112 and the second sub-sub-active part 4122, wherein the third sub-active part 413 may be formed by a part of the second sub-active part 412 and a part of the first sub-active part 411. As shown in FIG. 5, the second sub-active part 412 may further include an active part 416, an active part 417, an active part 401, an active part 404, an active part 403 and an active part 405. The active part 416 may be configured to form a channel region of the sixth transistor T6, the active part 417 may be configured to form a channel region of the seventh transistor T7, the active part 401 may be configured to form a channel region of the first transistor T1, the active part 404 may be configured to form a channel region of the fourth transistor T4, the active part 403 may be configured to form a channel region of the driving transistor T3, and the active part 405 may be configured to form a channel region of the fifth transistor T5. The second active part 42 may be connected to an end of the first sub-sub-active part 4112 that is distal to the second sub-sub-active part 4122 in the same first active part 41.

As shown in FIGS. 4, 6, 9 and 10, the first conductive layer may include a third gate line Re1, a reset signal line Re2, a first gate line Gate, a second gate line EM, a third conductive part 13, a first conductive part 11. The third gate line Re1 is configured to provide a reset signal to the first reset signal end in FIG. 1, and a part of structure of the third gate line Re1 may be configured to form the gate end of the first transistor T1. The reset signal line Re2 is configured to provide a reset signal to the second reset signal end in FIG. 1, and a part of structure of the reset signal line Re2 may be configured to form the gate end of the seventh transistor T7. The first gate line Gate is configured to provide a gate-driving signal to the gate-driving signal end in FIG. 1, and a part of structure of the first gate line Gate may be configured to form a second gate end of the second transistor T2 and the gate end of the fourth transistor T4. The second gate line EM is configured to provide an enable signal to the enable signal end in FIG. 1, and a part of structure of the second gate line EM may be configured to form the gate ends of the sixth transistor T6 and the fifth transistor T5. An orthographic projection of the third conductive part 13 on the base substrate covers an orthographic projection of the active part 403 on the base substrate, and the third conductive part 13 may be configured to form the gate end of the driving transistor T3 and an electrode of the capacitor C. The first conductive part 11 is connected to the first gate line Gate, an orthographic projection of the first conductive part 11 on the base substrate covers an orthographic projection of the first sub-sub-active part 4112 on the base substrate, and a part of structure of the first conductive part 11 is configured to form a first gate end of the second transistors T2. As shown in FIG. 6, the first conductive part 11 may include a first sub-conductive part 111. As shown in FIG. 9, in the second direction Y, an orthographic projection of the first sub-conductive part 111 on the base substrate is located between orthographic projections of two adjacent first active parts 41 in the same first active part group on the base substrate. As shown in FIG. 9, an orthographic projection of the third conductive part 13 on the base substrate may be located between an orthographic projection of the first gate line Gate on the base substrate and an orthographic projection of the second gate line EM on the base substrate, an orthographic projection of the third gate line Re1 on the base substrate may be located on a side of the orthographic projection of the first gate line Gate on the base substrate distal to the orthographic projection of the third conductive part 13 on the base substrate, and the reset signal line Re2 may be located on a side of the second gate line EM distal to the third conductive part 13.

As shown in FIGS. 4, 7, 9 and 10, the second conductive layer may include first initial signal lines Vinit1, second conductive parts 22 and fourth conductive parts 24, wherein each second conductive part 22 may include a second sub-conductive part 222 and a third sub-conductive part 223. Via holes 241 are formed in the fourth conductive part 24. The fourth conductive part 24 may be configured to form another electrode of the capacitor C.

As shown in FIGS. 4, 5 and 8, the third conductive layer may include second initial signal lines Vinit2, power supply lines VDD, data lines Data, connecting parts 31, connecting parts 32 and connecting parts 33. The power supply line VDD may provide the first power supply end VDD in FIG. 1, and the data line Data may be configured to provide the data signal end Da in FIG. 1. Each second initial signal line Vinit2 may include a plurality of first extending parts 342 distributed along an extending direction thereof, and first connecting parts 341 each connected between two adjacent first extending parts 342. As shown in FIGS. 4 and 5, the connecting part 31 may be connected to the first initial signal line Vinit1 and the active layer on a side of the active part 401 respectively through via holes (shown as black squares in the figure), so as to connect the second end of the first transistor T1 to the first initial signal line Vinit1. The connecting part 32 may be connected to the third conductive part 13 and the second active part 42 respectively through the via holes, so as to connect the first end of the second transistor T2 to the gate end of the driving transistor T3. The connecting part 33 may be connected to the active layer on a side of the active part 416 through a via hole to connect the second end of the sixth transistor T6, and the connecting part 33 may be connected to an anode of the light-emitting unit. The power supply line VDD may be connected to the fourth conductive part 24 through a via hole to connect the capacitor to the first power end. The power supply line VDD may further be connected to the second conductive part 22 through a via hole. The second initial signal line Vinit2 may be connected to the active layer at one end of the active part 417 distal to the active part 416 through a via hole, so as to connect the first end of the seventh transistor T7 to the second initial signal end.

In this exemplary embodiment, a conductive processing can be conducted on the active layer of the display panel by using a patterned first conductive layer as a mask, that is, a part of the active layer shielded by the first conductive layer forms a semiconductor channel region, and a part of the active layer not shielded by the first conductive layer forms a conductive active layer. In this exemplary embodiment, as shown in FIGS. 4, 5, 9, 10, and 11, the conductive third sub-active part 413 is connected between the first sub-sub-active part 4112 and the second sub-sub-active part 4122, and under coupling effect of other conductive structures, a potential of the third sub-active part 413 is prone to be changed, thereby causing the third sub-active part 413 to leak current to the source/drain electrodes of the second transistor T2. An orthographic projection of the second sub-conductive part 222 on the base substrate may at least partially overlap with an orthographic projection of the third sub-active part 413 on the base substrate, and since the second sub-conductive part 222 is connected to the stable power supply line VDD, the second sub-conductive part 222 may function as stabilizing voltage of the third sub-active part 413 to a certain extent, thereby reducing leakage current of the source/drain electrodes of the second transistor T2.

In this exemplary embodiment, as shown in FIGS. 4, 5 and 7, an orthographic projection of the third sub-conductive part 223 on the base substrate may at least partially overlap with an orthographic projection of the second active part 42 on the base substrate, and since the third sub-conductive part 223 is connected to the power supply line VDD, the second active part 42 is connected to the gate end of the driving transistor T3 (the third conductive part 13), and the third sub-conductive part 223 has voltage stabilization effect on the gate end of the driving transistor, thereby it may make the gate end of the driving transistor have a relatively stable voltage during the light-emitting phase of the pixel-driving circuit. It should be noted that, as shown in FIGS. 4, 5 and 7, the second sub-conductive part 222 and the third sub-conductive part 223 in the same second conductive part 22 respectively act on the third sub-active part 413 and the second active part 42 in adjacent two pixel-driving circuits.

In this exemplary embodiment, as shown in FIGS. 4 and 8, a plurality of first extending parts 342 are provided in a one-to-one correspondence with a plurality of the first active parts 41. Any segment of orthographic projection of each first extending part 342 on the base substrate along an extending direction of the first extending part 342 at least partially overlaps with an orthographic projection of the first active part 41 corresponding to the first extending part 342 on the base substrate. That is, the orthographic projection of the first extending part 342 on the base substrate and the orthographic projection of the first active part 41 on the base substrate have the same extending direction, and an orthographic projection of overlapped part of the first extending part 342 and the first active part 41 on the base substrate and the orthographic projection of the first extending part 342 on the base substrate have the same extension direction as well.

One extending side of the orthographic projection of the above overlapped part (i.e., a side extending in an extending manner of the overlapped part) overlaps with an orthographic projection of at least one extending side of the first active part 41 on the base substrate. With this arrangement, a part of structure of the second initial signal line Vinit2 may be arranged directly above the first active part 41, thereby reducing light-blocking effect of the second initial signal line Vinit2, that is, increasing light transmittance of the display panel.

In the present exemplary embodiment, as shown in FIGS. 4 and 8, an orthographic projection of the first connecting part 341 on the base substrate may at least partially overlap with an orthographic projection of the first sub-conductive part 111 on the base substrate. This setting can further reduce light-blocking effect of the second initial signal line Vinit2.

In this exemplary embodiment, as shown in FIGS. 4, 6 and 9, the first gate line Gate may include a plurality of second extending parts G2 and a plurality of third extending parts G3, and the plurality of second extending parts G2 and the plurality of the third extending parts G3 may be alternately connected in sequence in the first direction X. An orthographic projection of at least a part of the second extending part G2 on the base substrate may be disposed in opposite to an orthographic projection of the third conductive part 13 on the base substrate in the second direction Y, and a distance between the orthographic projection of the second extending part G2 on the base substrate and the orthographic projection of the third conductive part 13 on the base substrate in the second direction Y is greater than a distance between an orthographic projection of the third extending part G3 on the base substrate and the orthographic projection of the third conductive part 13 on the base substrate in the second direction Y. The expression that an orthographic projection of at least a part of the second extending part G2 on the base substrate may be disposed in opposite to an orthographic projection of the third conductive part 13 on the base substrate in the second direction Y, may be understood as, an area covered by the orthographic projection of at least a part of the second extending part G2 on the base substrate when the orthographic projection of at least a part of the second extending part G2 on the base substrate moves in the second direction, overlaps with an area covered by the orthographic projection of the third conductive part 13 on the base substrate when the orthographic projection of the third conductive part 13 on the base substrate moves in the second direction. The expression that a distance between the orthographic projection of the second extending part G2 on the base substrate and the orthographic projection of the third conductive part 13 on the base substrate in the second direction Y, may be understood as, a distance between two adjacent sides of the orthographic projection of the second extending part G2 on the base substrate and the orthographic projection of the third conductive part 13 on the base substrate in the second direction Y. Similarly, the expression that a distance between the orthographic projection of the third extending part G3 on the base substrate and the orthographic projection of the third conductive part 13 on the base substrate in the second direction Y, may be understood as, a distance between two adjacent sides of the orthographic projection of the third extending part G3 on the base substrate and the orthographic projection of the third conductive part 13 on the base substrate in the second direction Y. As shown in FIGS. 4, 6 and 9, the second extending part G2 may be formed by notching a side of the first gate line Gate facing the third conductive part 13. On the one hand, this arrangement reduces difficulty of process for patterning the second conductive layer by reducing the distance between the second extending part G2 and the third conductive part 13 in the second direction Y, on the other hand, this arrangement reduces coupling effect of the first gate line Gate on the gate end of the driving transistor (the third conductive part 13), thus improving voltage stability of the gate end of the driving transistor in the light-emitting phase.

In this exemplary embodiment, as shown in FIGS. 4, 6 and 9, the second gate line may include a plurality of fourth extending parts E4 and a plurality of fifth extending parts E5, and the plurality of fourth extending parts E4 and the plurality of the fifth extending parts E5 may be alternately connected in sequence in the first direction X. An orthographic projection of at least a part of the fourth extending part E4 on the base substrate may be disposed in opposite to an orthographic projection of the third conductive part 13 on the base substrate in the second direction Y, and a distance between the orthographic projection of the fourth extending part E4 on the base substrate and the orthographic projection of the third conductive part 13 on the base substrate in the second direction Y is greater than a distance between an orthographic projection of the fifth extending part E5 on the base substrate and the orthographic projection of the third conductive part 13 on the base substrate in the second direction Y. The expression that an orthographic projection of at least a part of the fourth extending part E4 on the base substrate may be disposed in opposite to an orthographic projection of the third conductive part 13 on the base substrate in the second direction Y, may be understood as, an area covered by the orthographic projection of at least a part of the fourth extending part E4 on the base substrate when the orthographic projection of at least a part of the fourth extending part E4 on the base substrate moves in the second direction, overlaps with an area covered by the orthographic projection of the third conductive part 13 on the base substrate when the orthographic projection of the third conductive part 13 on the base substrate moves in the second direction. The expression that a distance between the orthographic projection of the fourth extending part E4 on the base substrate and the orthographic projection of the third conductive part 13 on the base substrate in the second direction Y, may be understood as, a distance between two adjacent sides of the orthographic projection of the fourth extending part E4 on the base substrate and the orthographic projection of the third conductive part 13 on the base substrate in the second direction Y. Similarly, the expression that a distance between the orthographic projection of the fifth extending part E5 on the base substrate and the orthographic projection of the third conductive part 13 on the base substrate in the second direction Y, may be understood as, a distance between two adjacent sides of the orthographic projection of the fifth extending part E5 on the base substrate and the orthographic projection of the third conductive part 13 on the base substrate in the second direction Y. As shown in FIGS. 4, 6 and 9, the fourth extending part E4 may be formed by notching a side of the second gate line EM facing the third conductive part 13. On the one hand, this arrangement reduces difficulty of process for patterning the second conductive layer by reducing the distance between the fourth extending part E4 and the third conductive part 13 in the second direction Y, on the other hand, this arrangement reduces coupling effect of the second gate line EM on the gate end of the driving transistor (the third conductive part 13), thus improving voltage stability of the gate end of the driving transistor in the light-emitting phase.

In this exemplary embodiment, as shown in FIGS. 4 and 8, the power supply line VDD may include a sixth extending part V6 and a seventh extending part V7, an orthographic projection of the sixth extending part V6 on the base substrate may at least partially overlap with an orthographic projection of the third sub-conductive part 223 on the base substrate, and the sixth extending part V6 may be connected to the third sub-conductive part 223 through a via hole. The seventh extending part V7 may be connected to the sixth extending part V6, an orthographic projection of the seventh extending part V7 on the base substrate may intersect with the orthographic projection of the first gate line Gate on the base substrate, and a size of the orthographic projection of the sixth extending part V6 on the base substrate in the first direction X is larger than a size of the orthographic projection of the seventh extending part V7 on the base substrate in the first direction X. This arrangement reduces the size of the seventh extending part V7 in the first direction X, thereby reducing coupling effect between the power supply line VDD and the first gate line Gate, thus improving charging speed of the first gate line Gate. The seventh extending part V7 may be formed by notching a side of the power supply line VDD facing the third conductive part 13.

In this exemplary embodiment, as shown in FIGS. 4 and 8, the power supply line may further include an eighth extending part V8, and the eighth extending part V8 may be connected to one end of the sixth extending part V6 distal to the seventh extending part V7, an orthographic projection of the eighth extending part V8 on the base substrate may intersect with the orthographic projection of the third gate line Re1 on the base substrate, and a size of the orthographic projection of the eighth extending part V8 on the base substrate in the first direction X may be less than a size of the orthographic projection of the sixth extending part V6 on the base substrate in the first direction X. This arrangement reduces the size of the eighth extending part V8 in the first direction X, thereby reducing coupling effect between the power supply line VDD and the third gate line Re1, thus improving charging speed of the third gate line Re1. The eighth extending part V8 may be formed by notching a side of the power supply line VDD facing the third conductive part 13.

Similarly, as shown in FIGS. 4 and 8, a size of an overlapped part of the power supply line VDD and the reset signal line Re2 of the display panel in the first direction may be reduced as well.

In this exemplary embodiment, as shown in FIGS. 4 and 8, the third conductive layer may further include a first convex part 35, the first convex part 35 may be connected to the power supply line VDD, and an orthographic projection of the first convex part 35 on the base substrate may at least partially overlap with the orthographic projection of the third conductive part 13 on the base substrate. As shown in FIG. 8, the first convex part 35 may include a first side 351, the power supply line VDD may include a second side 352 connected to the first side 351, and an angle between an orthographic projection of the first side 351 on the base substrate and an orthographic projection of the second side 352 on the base substrate may be less than 180°. The first convex part 35 having a stable voltage may function as stabilizing the gate end of the driving transistor (the third conductive part 13), thereby improving the stability of the voltage of the gate end of the driving transistor at the light-emitting node.

In this exemplary embodiment, as shown in FIG. 4, there may be a plurality of second initial signal lines, and each column of pixel-driving circuits corresponds to one of the second initial signal lines.

Figure 12:
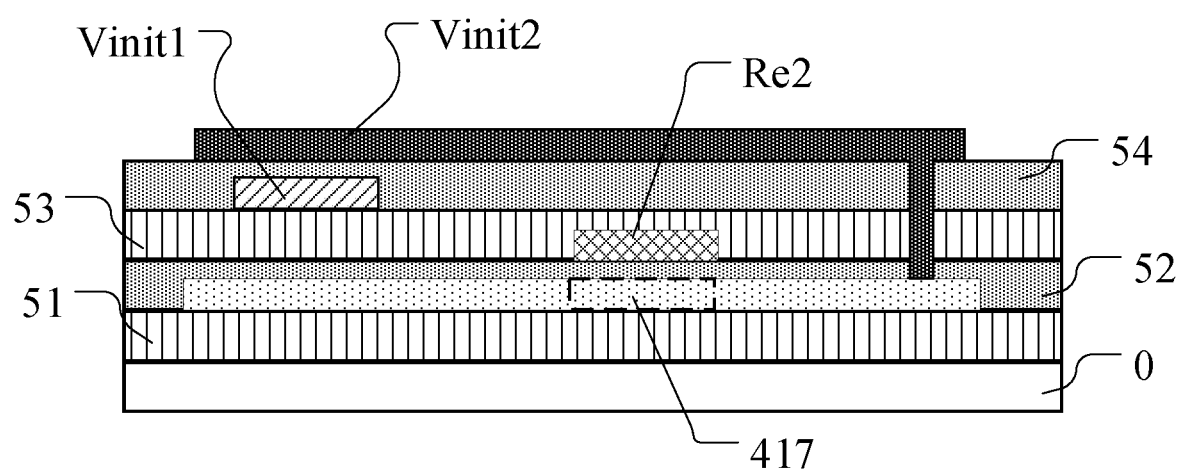
FIG. 12 is a partial cross-sectional view along a dashed line A in FIG. 4.

As shown in FIG. 12, it is a partial cross-sectional view along a dashed line A in FIG. 4. The display panel may further include a buffer layer 51, a first insulating layer 52, a second insulating layer 53 and a dielectric layer 54, wherein a base substrate 0, the buffer layer 51, the active layer, the first insulating layer 52, the first conductive layer, the second insulating layer 53, the second conductive layer, the dielectric layer 54 and the third conductive layer are stacked in sequence. The first insulating layer and the second insulating layer may be silicon oxide layers, and the dielectric layer may be a silicon nitride layer. The buffer layer may be a silicon oxide layer. The base substrate may be formed of insulating material, for example, the base substrate may include a first polyimide (PI) layer, a first silicon oxide (SiO) layer, an amorphous silicon layer, a second polyimide (PI) layer and a second silicon dioxide layer, arranged in sequence. The active layer may be formed by polycrystalline silicon semiconductor or metal oxide semiconductor.

Figure 13:
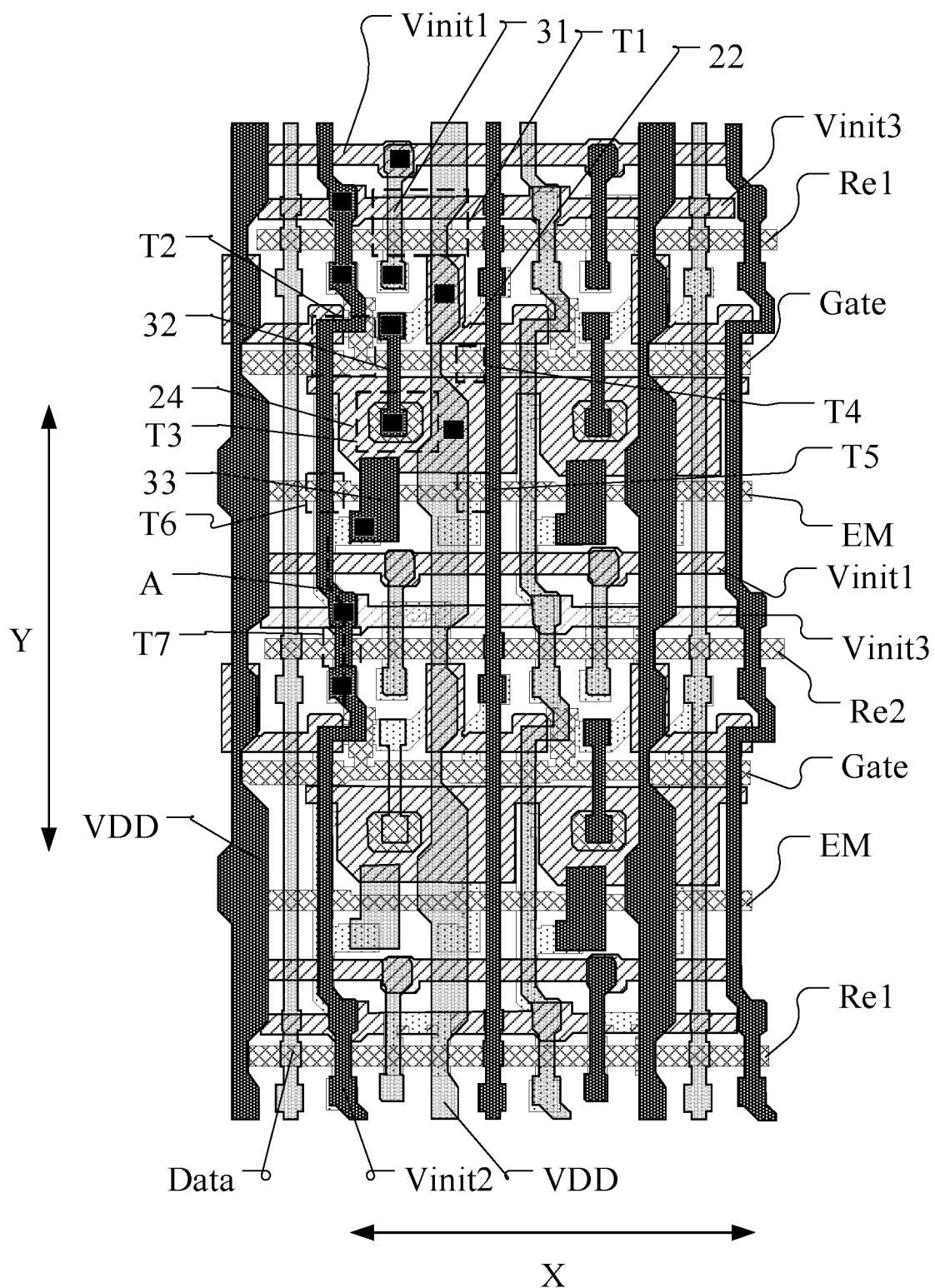
FIG. 13 is a structural layout of another exemplary embodiment of the display panel of the present disclosure.
Figure 14:
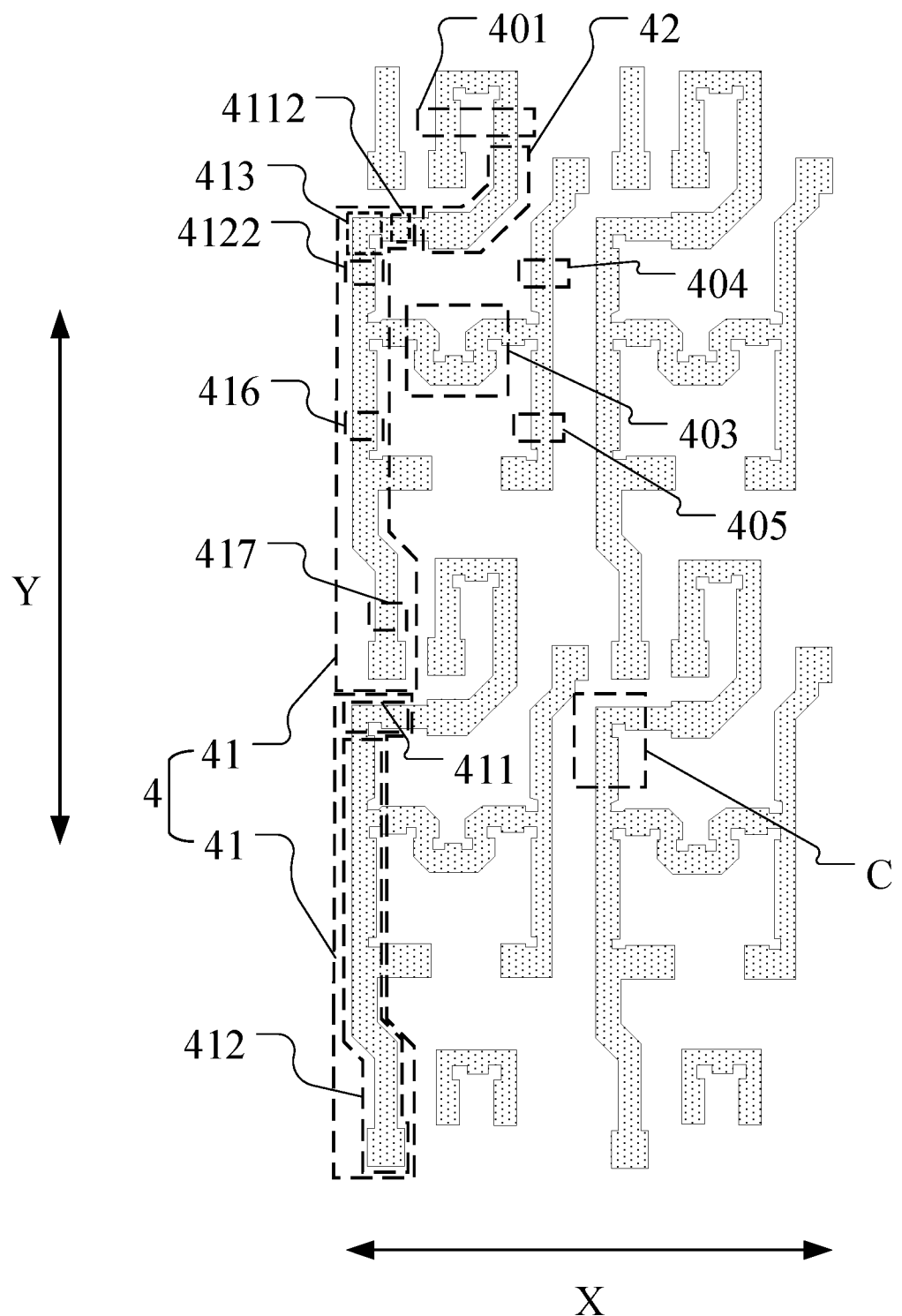
FIG. 14 is a structural layout of a active layer in FIG. 13.
Figure 15:
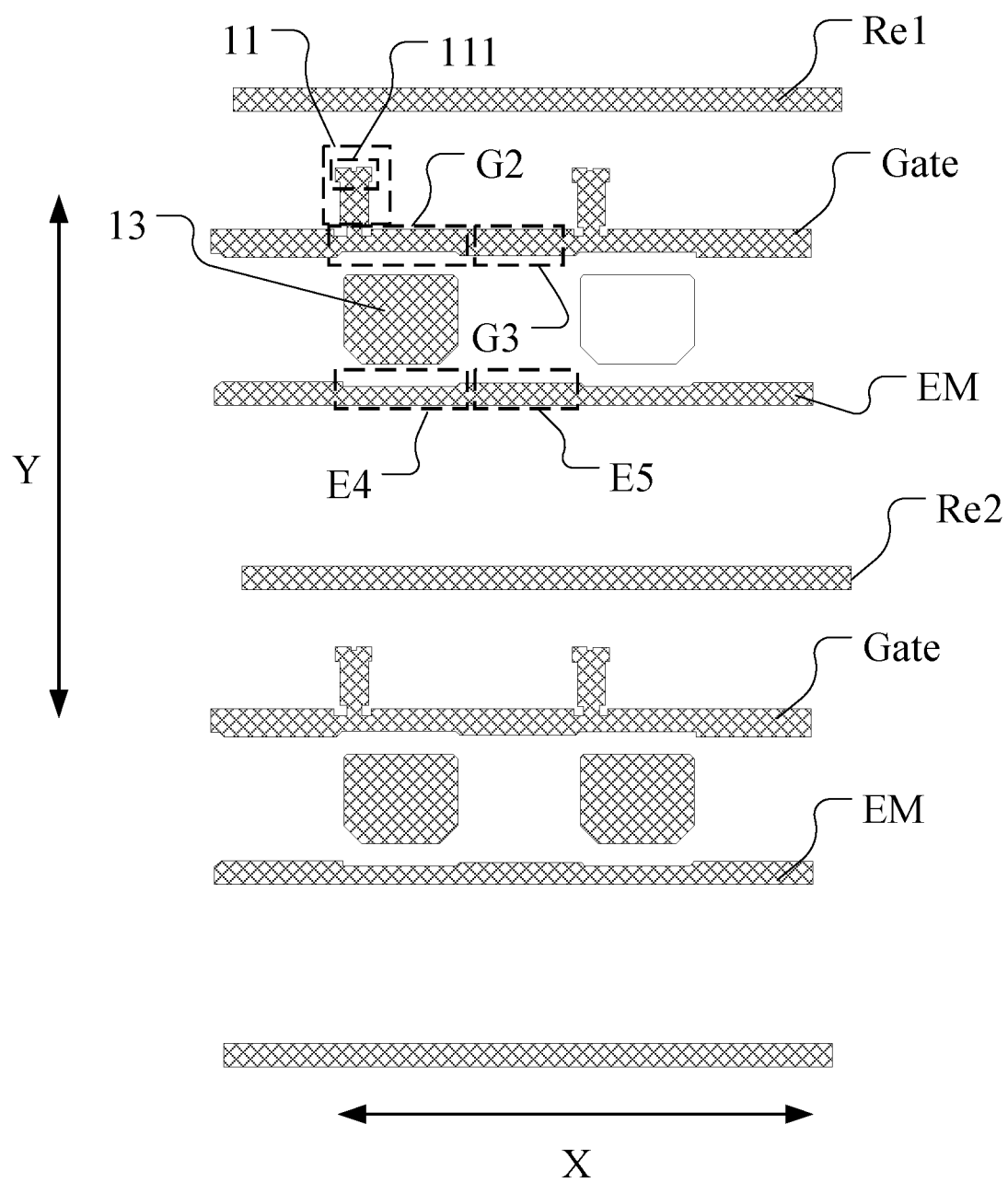
FIG. 15 is a structural layout of a first conductive layer in FIG. 13.
Figure 16:
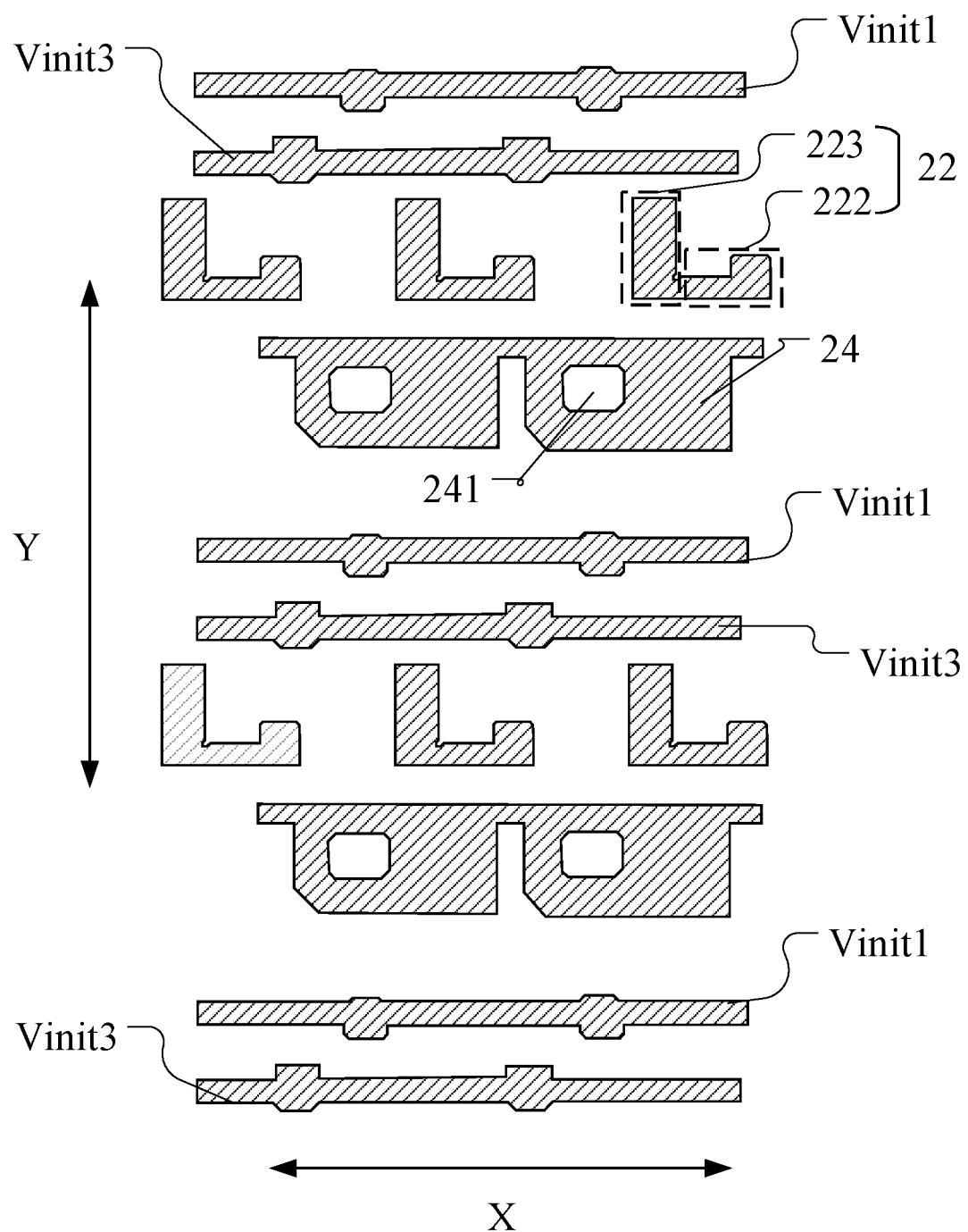
FIG. 16 is a structural layout of a second conductive layer in FIG. 13.
Figure 17:
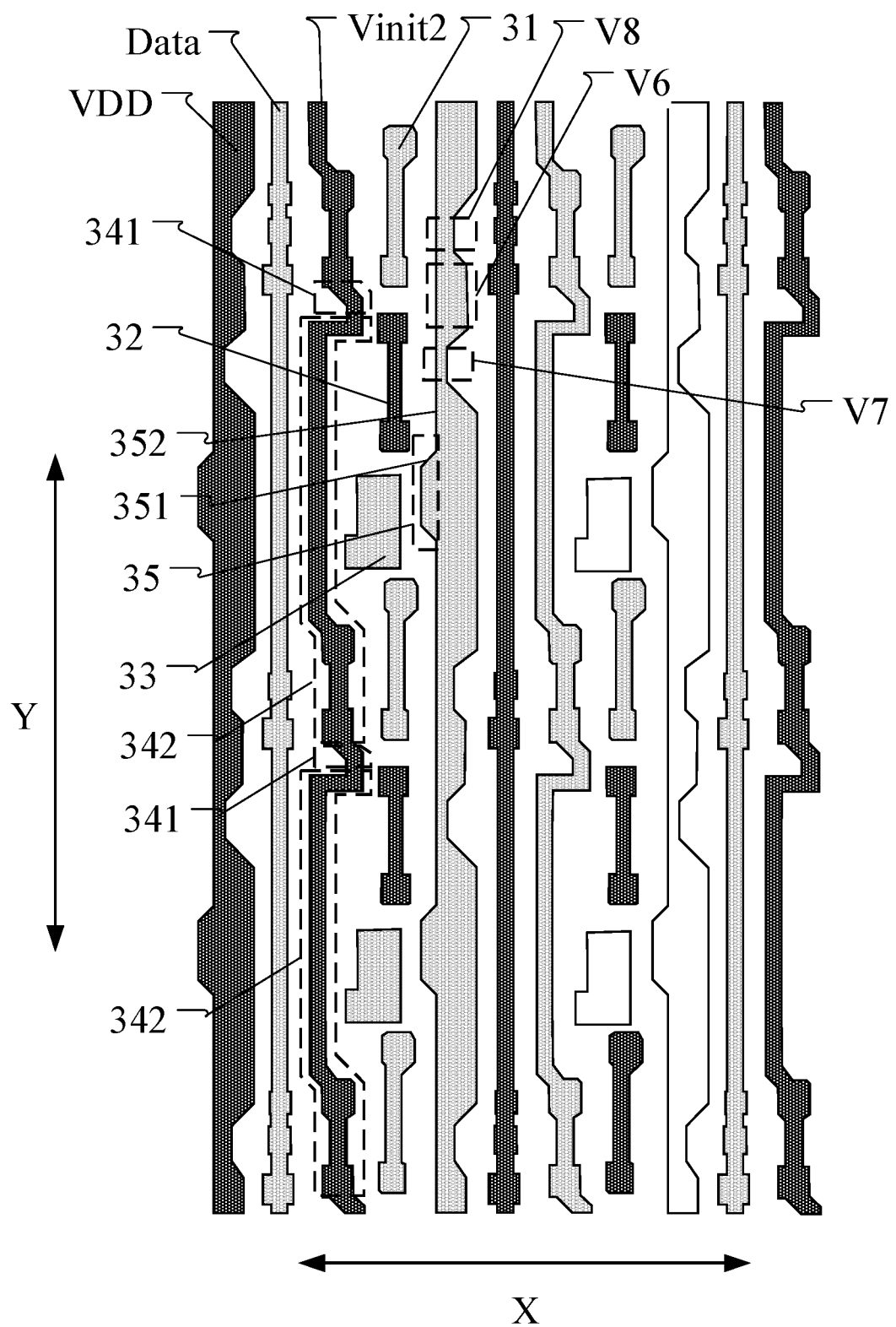
FIG. 17 is a structural layout of a source-drain layer in FIG. 13.
Figure 18:
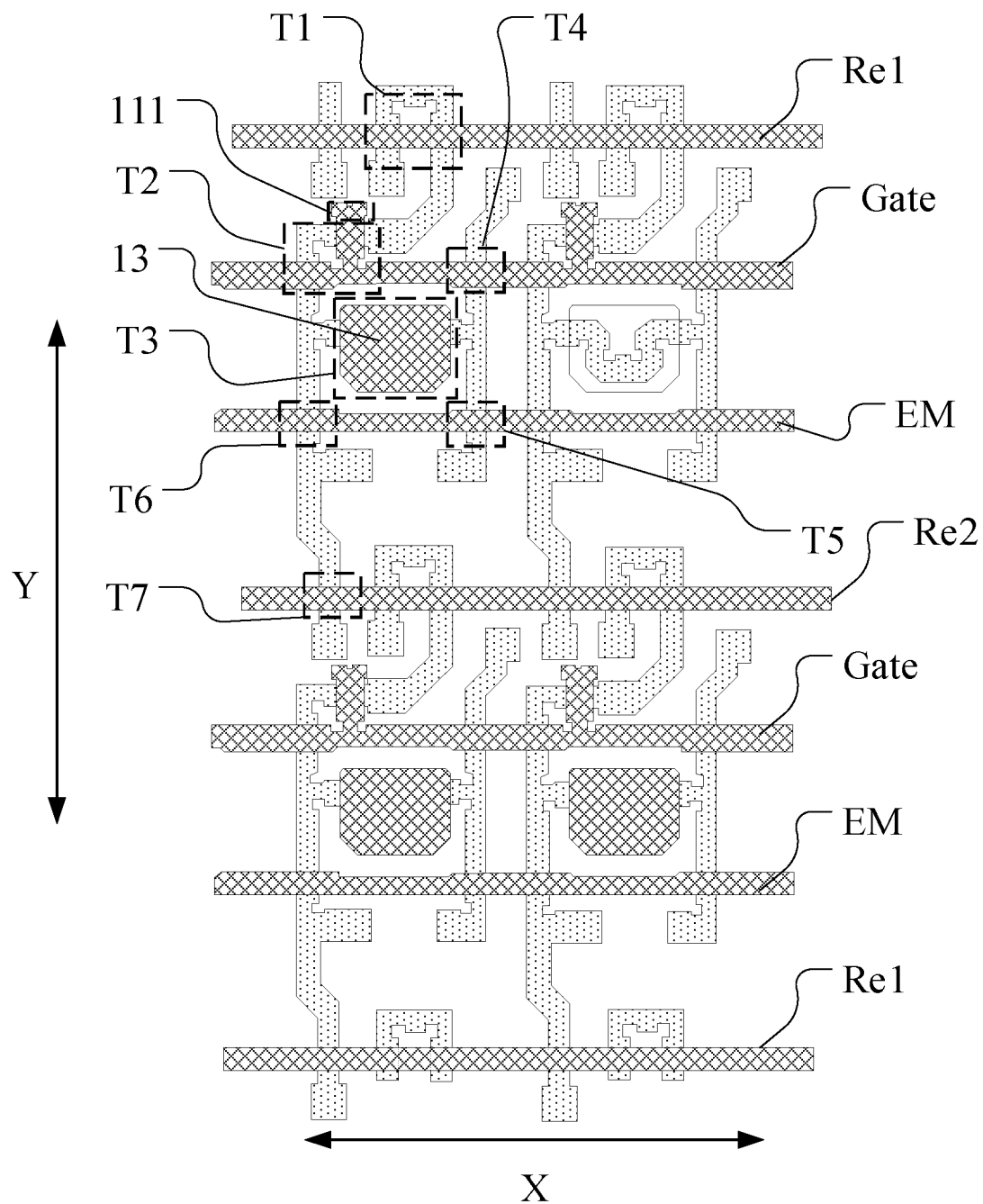
FIG. 18 is a structural layout of a stacking of the active layer and the first conductive layer in FIG. 13.
Figure 19:
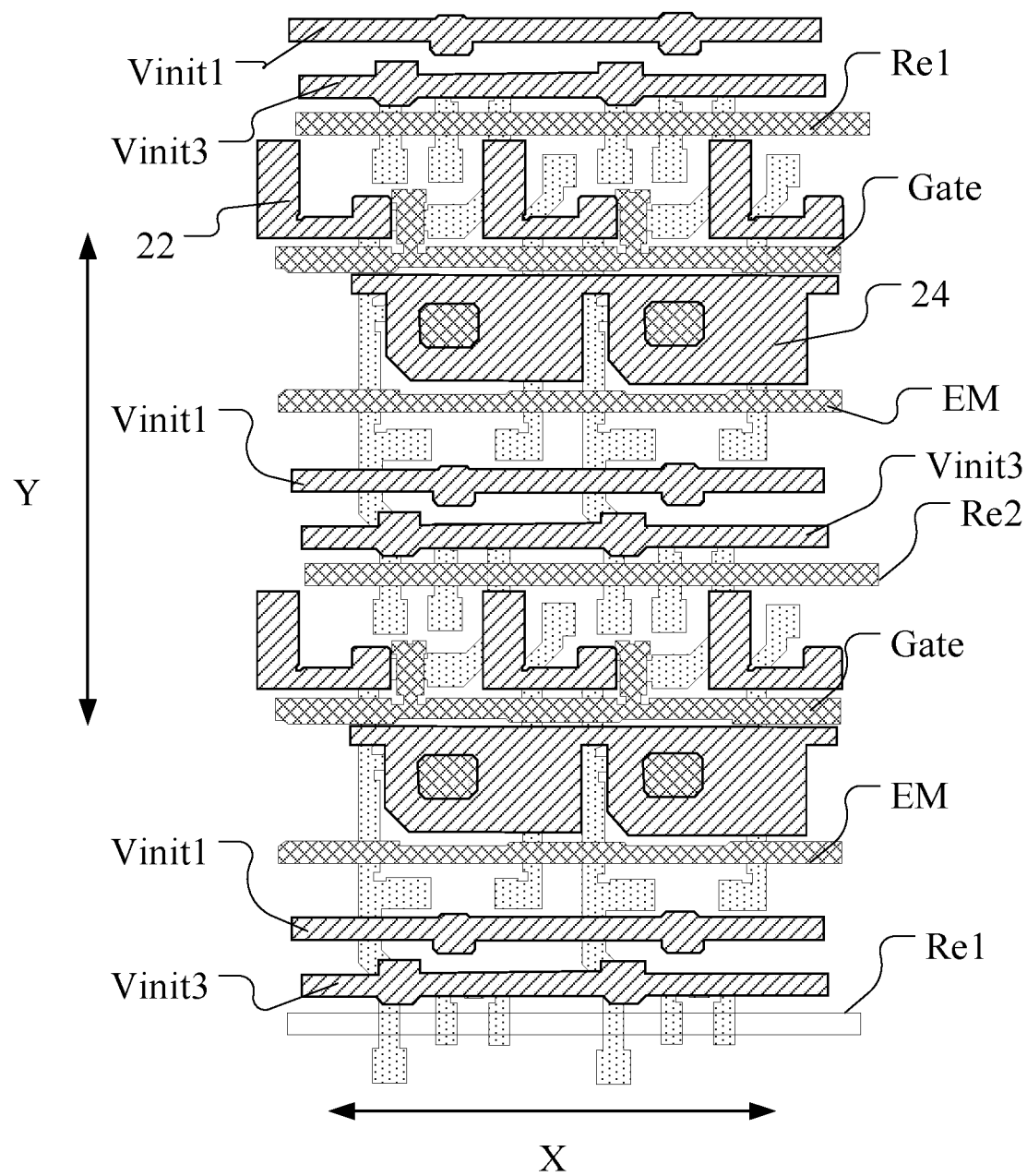
FIG. 19 is a structural layout of a stacking of the active layer, the first conductive layer and the second conductive layer in FIG. 13.

As shown in FIGS. 13-19, FIG. 13 is a structural layout of another exemplary embodiment of the display panel of the present disclosure, FIG. 14 is a structural layout of the active layer in FIG. 13, FIG. 15 is a structural layout of the first conductive layer in FIG. 13, FIG. 16 is a structural layout of the second conductive layer in FIG. 13, FIG. 17 is a structural layout of the source-drain layer in FIG. 13, FIG. 18 is a structural layout of the stacking of the active layer and the first conductive layer in FIG. 13, and FIG. 19 is a structural layout of the stacking of the active layer, the first conductive layer and the second conductive layer in FIG. 13.

A structure of the display panel shown in FIG. 13 is basically the same as that of the display panel shown in FIG. 4. The display panel shown in FIG. 13 is different from the display panel shown in FIG. 4 only in that the second conductive layer in the display panel shown in FIG. 13 further includes a plurality of third initial signal lines Vinit3, and the third initial signal line Vinit3 and the second initial signal line Vinit2 may collectively output the second initial signal. Orthographic projections of the plurality of third initial signal lines Vinit3 on the base substrate may extend along the first direction X and be distributed at intervals along the second direction Y. The orthographic projection of the third initial signal line Vinit3 may be located between the orthographic projection of the first initial signal line Vinit1 on the base substrate and the orthographic projection of the reset signal line Re2 on the base substrate. As shown in FIGS. 13 and 14, the respective second initial signal lines Vinit2 may be connected to the respective third initial signal lines Vinit3 through via holes respectively. In the display panel, the third initial signal line Vinit3 and the second initial signal line Vinit2 may form a grid structure, thereby further reducing the voltage drop of the second initial signal. In other exemplary embodiments, it may connect only a part of the third initial signal lines to at least a part of the second initial signal lines through via holes in the display panel as well.

Figure 20:
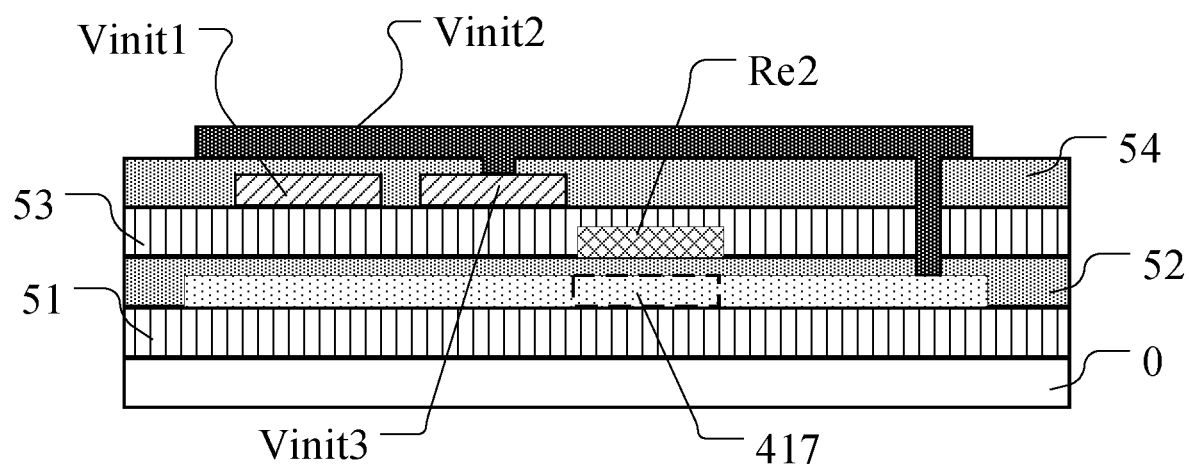
FIG. 20 is a partial cross-sectional view of a dashed line A in FIG. 14.

As shown in FIG. 20, it is a partial cross-sectional view along a dashed line A in FIG. 14, and different from FIG. 12, the second initial signal line Vinit2 is further connected to the third initial signal line Vinit3 through via holes.

Figure 21:
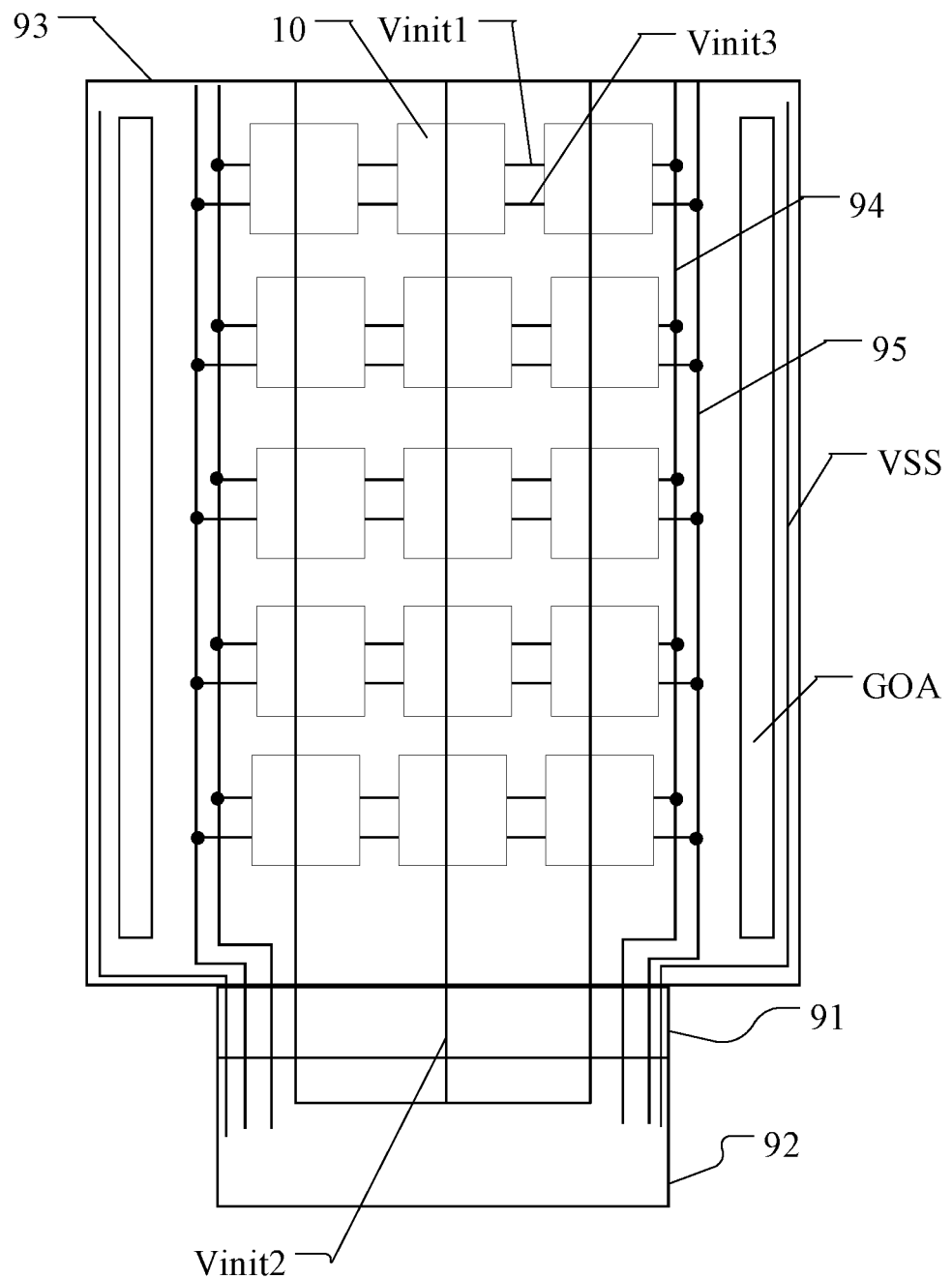
FIG. 21 is a functional block diagram of an exemplary embodiment of a display panel of the present disclosure.

As shown in FIG. 21, it is a functional block diagram of an exemplary embodiment of the display panel of the present disclosure. The display panel may include a circuit integration area 93, a bending area 91 and a bonding area 92.

The circuit integration area 93 may be configured to integrate circuit structures such as pixel-driving circuits 10 and a gate-driving circuit GOA. The gate-driving circuit GOA may provide the pixel-driving circuits 10 with driving signals such as a reset signal, a gate-driving signal and an enable signal. The bending area 91 may be bent to bend the binding area 92 to the back of the display panel. The bonding region 92 may be bonded and connected with a chip or a circuit board (e.g., a COF, Chip On Film), so as to provide driving signals to the pixel-driving circuits and the gate-driving circuit through the chip. As shown in FIGS. 13 and 21, the first initial signal line Vinit1 and the third initial signal line Vinit3 may be respectively connected to signal transmission lines 94 and 95 extending in column direction, and the signal transmission lines 94 and 95 may be connected to the chip for providing initial signals in the bonding area 92. The second initial signal line Vinit2 may directly extend to the bonding area in the column direction to be connected with the chip for providing the initial signal.

The exemplary embodiment further provides a display device, wherein the display device includes the above-mentioned display panel. The display device may be a display device such as a mobile phone, a tablet computer, or the like.

Other embodiments of the present disclosure will readily suggest themselves to those skilled in the art upon consideration of the specification and practice of what is disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel, comprising a plurality of pixel-driving circuits, wherein the display panel further comprises:
    a base substrate;
    a second conductive layer, located on a side of the base substrate, wherein the second conductive layer comprises first initial signal lines, and the first initial signal lines are configured to provide first initial signals to the pixel-driving circuits; and
    a third conductive layer, located on a side of the second conductive layer distal to the base substrate, wherein the third conductive layer comprises second initial signal lines, and the second initial signal lines are configured to provide second initial signals to the pixel-driving circuits;
    wherein, sheet resistance of a second conductive layer is greater than sheet resistance of the third conductive layer;
    wherein an orthographic projection of at least a part of one of the first initial signal lines on the base substrate extends along a first direction;
    an orthographic projection of at least a part of one of the second initial signal lines on the base substrate extends along a second direction, and the first direction and the second direction intersect;
    the first initial signal lines are configured to provide the first initial signals to the plurality of pixel-driving circuits distributed along the first direction, respectively; and
    the second initial signal lines are configured to provide the second initial signals to the plurality of pixel-driving circuits distributed along the second direction, respectively.

2. The display panel according to claim 1, wherein the third conductive layer further comprises:
    a power supply line, wherein an orthographic projection of the power supply line on the base substrate extends along the second direction.

3. The display panel according to claim 2, wherein the pixel-driving circuit is configured to drive a light-emitting unit to emit light, the pixel-driving circuit comprises a driving transistor, a first transistor and a seventh transistor, the first transistor has a second end configured to receive the first initial signal and the first end is connected to a gate end of the driving transistor, and the seventh transistor has a first end configured to receive the second initial signal and a second end configured to connect an anode of the light-emitting unit.

4. The display panel according to claim 3, wherein the pixel-driving circuit comprises a plurality of transistors, the display panel further comprises an active layer, the active layer is located between the base substrate and the second conductive layer, a part of the active layer is configured to form channel regions of the transistors, and the active layer comprises:
    a first active part group, comprising a plurality of first active parts, wherein orthographic projections of the plurality of first active parts on the base substrate are distributed at intervals in the second direction, and orthographic projection of a part of each of the first active parts on the base substrate extends along the second direction; and
    the second initial signal line comprises:
    a plurality of first extending parts, arranged in a one-to-one correspondence with the first active parts, wherein any segment of orthographic projection of each of the first extending parts on the base substrate along an extending direction of the first extending part at least partially overlaps with an orthographic projection of the first active part corresponding to the first extending part on the base substrate.

5. The display panel according to claim 4, wherein the pixel-driving circuit further comprises a second transistor and a sixth transistor;
    the second transistor has a first end connected to the gate end of the driving transistor, a second end connected to a first end of the driving transistor, and a gate end connected to a gate-driving signal end;
    the sixth transistor has a first end connected to the first end of the driving transistor, a second end connected to the anode of the light-emitting unit, and a gate end connected to an enable signal end; and
    each of the first active parts comprises:
    a first sub-active part, wherein an orthographic projection of the first sub-active part on the base substrate extends along the first direction, wherein the first sub-active part comprises a first sub-sub-active part configured to form a first channel region of the second transistor; and
    a second sub-active part, connected to the first sub-active part, wherein an orthographic projection of at least a part of the second sub-active part on the base substrate extends along the second direction, wherein the second sub-active part comprises a second sub-sub-active part, configured to form a second channel region of the second transistor, and a part of second sub-active parts are configured to form channel regions of the sixth transistor and the seventh transistor;

wherein, in the same first active part group, orthographic projections of a plurality of first sub-active parts on the base substrate and orthographic projections of a plurality of the second sub-active parts on the base substrate are alternately distributed in sequence in the second direction.

6. The display panel according to claim 5, wherein the display panel further comprises a first conductive layer, the first conductive layer is located between the active layer and the second conductive layer, and the first conductive layer comprises:

a first conductive part, wherein an orthographic projection of the first conductive part on the base substrate intersects with the orthographic projection of the first sub-active part on the base substrate, and a part of structure of the first conductive part is configured to form a first gate end of the second transistor;

wherein the first conductive part comprises a first sub-conductive part, and in the second direction, an orthographic projection of the first sub-conductive part on the base substrate is located between orthographic projections of two adjacent first active parts in the same first active part group on the base substrate; and the second initial signal line further comprises:

a plurality of first connecting parts, wherein each of the first connecting parts is connected between two adjacent first extending parts, and an orthographic projection of the first connecting part on the base substrate and the orthographic projection of the first sub-conductive part on the base substrate at least partially overlap.

7. The display panel according to claim 5, wherein the first active part further comprises:

a third sub-active part, connected between the first sub-sub-active part and the second sub-sub-active part, and the third sub-active part is formed by a part of the first sub-active part and a part of the second sub-active par; and the second conductive layer further comprises:

a second conductive part, connected to the power supply line, wherein an orthographic projection of the second conductive part on the base substrate and n orthographic projection of the third sub-active part on the base substrate at least partially overlap.

8. The display panel according to claim 7, wherein a plurality of the pixel-driving circuits comprise a first pixel-driving circuit and a second pixel-driving circuit adjacent in the first direction;

the first conductive layer comprises:

a third conductive part, configured to form the gate end of the driving transistor;

the active layer further comprises:

a second active part, connected to an end of the first sub-sub-active part that is distal to the second sub-sub-active part in the same first active part, wherein the second active part is connected to the third conductive part; and the second conductive part comprises:

a second sub-conductive part, wherein an orthographic projection of the second sub-conductive part on the base substrate at least partially overlaps with the orthographic projection of the third sub-active part in the first pixel-driving circuit on the base substrate; and a third sub-conductive part, connected to the second sub-conductive part, wherein an orthographic projection of the third sub-conductive part on the base substrate at least partially overlaps with an orthographic projection of the second active part in the second pixel-driving circuit on the base substrate.

9. The display panel according to claim 8, wherein the first conductive layer further comprises:

a first gate line, wherein an orthographic projection of the first gate line on the base substrate extends along the first direction, the orthographic projection of the first gate line on the base substrate and the orthographic projection of the second sub-active part on the base substrate intersects, at least a part of the first gate line is configured to form a second gate end of the second transistor, and the second gate line is connected to the first conductive part; and a second gate line, wherein an orthographic projection of the second gate line on the base substrate extends along the first direction, the orthographic projection of the second gate line on the base substrate and the orthographic projection of the second sub-active part on the base substrate intersects, and at least a part of the second gate line is configured to form a gate end of the sixth transistor;

wherein an orthographic projection of the third conductive part on the base substrate is located between the orthographic projection of the first gate line on the base substrate and the orthographic projection of the second gate line on the base substrate.

10. The display panel according to claim 9, wherein the first gate line comprises:

a plurality of second extending parts; and a plurality of third extending parts, wherein the plurality of second extending parts and the plurality of the third extending parts are alternately connected in sequence in the first direction;

wherein, an orthographic projection of at least a part of the second extending part on the base substrate is disposed in opposite to the orthographic projection of the third conductive part on the base substrate in the second direction, and a distance between the orthographic projection of the second extending part on the base substrate and the orthographic projection of the third conductive part on the base substrate in the second direction is greater than a distance between an orthographic projection of the third extending part on the base substrate and the orthographic projection of the third conductive part on the base substrate in the second direction.

11. The display panel according to claim 9, wherein the second gate line comprises:

a plurality of fourth extending parts; and a plurality of fifth extending parts, wherein the plurality of fourth extending parts and the plurality of the fifth extending parts are alternately connected in sequence in the first direction;

wherein, an orthographic projection of at least a part of the fourth extending part on the base substrate is disposed in opposite to an orthographic projection of the third conductive part on the base substrate in the second direction, and a distance between the orthographic projection of the fourth extending part on the base substrate and the orthographic projection of the third conductive part on the base substrate in the second direction is greater than a distance between an orthographic projection of the fifth extending part on the base substrate and the orthographic projection of the third conductive part on the base substrate in the second direction.

12. The display panel according to claim 9, wherein the power supply line comprises:
   a sixth extending part, wherein an orthographic projection of the sixth extending part on the base substrate at least partially overlaps with the orthographic projection of the third sub-conductive part on the base substrate, and the sixth extending part is connected to the third sub-conductive part through a via hole; and
   a seventh extending part, connected to the sixth extending part, wherein an orthographic projection of the seventh extending part on the base substrate intersects with the orthographic projection of the first gate line on the base substrate, and a size of the orthographic projection of the sixth extending part on the base substrate in the first direction is larger than a size of the orthographic projection of the seventh extending part on the base substrate in the first direction.

13. The display panel according to claim 12, wherein the first conductive layer further comprises:
   a third gate line, wherein an orthographic projection of the third gate line on the base substrate extends along the first direction, the orthographic projection of the third gate line on the base substrate is located on a side of the orthographic projection of the first gate line on the base substrate distal to the orthographic projection of the third conductive part on the base substrate, and a part of the third gate line is configured to form the gate end of the first transistor; and
   the power supply line further comprises:
   an eighth extending part, connected to an end of the sixth extending part distal to the seventh extending part, wherein an orthographic projection of the eighth extending part on the base substrate intersects with the orthographic projection of the third gate line on the base substrate, and a size of the orthographic projection of the eighth extending part on the base substrate in the first direction is less than a size of the orthographic projection of the sixth extending part on the base substrate in the first direction.

14. The display panel according to claim 8, wherein the third conductive layer further comprises:
   a first convex part, connected to the power supply line, wherein an orthographic projection of the first convex part on the base substrate at least partially overlaps with the orthographic projection of the third conductive part on the base substrate;
   wherein the first convex part comprises a first side, the power supply line comprises a second side connected to the first side, and an angle between an orthographic projection of the first side on the base substrate and an orthographic projection of the second side on the base substrate may be less than 180°.

15. The display panel according to claim 1, wherein a number of the second initial signal lines is plural, and the second conductive layer further comprises:
   a plurality of third initial signal lines, configured to provide the second initial signal to the pixel-driving circuits, and orthographic projections of the plurality of third initial signal lines on the base substrate extend along the first direction and are distributed at intervals along the second direction;
   wherein at least a part of the third initial signal line is connected to at least a part of the second initial signal line through via holes.

16. The display panel according to claim 15, wherein the respective second initial signal lines are connected to the respective third initial signal lines through via holes, respectively.

17. The display panel according to claim 1, wherein the second direction is a column direction, a number of the second initial signal lines is plural, and each column of pixel-driving circuits corresponds to one of the second initial signal lines.

18. A display device, comprising: the display panel according to claim 1.

19. A display panel, comprising a plurality of pixel-driving circuits, wherein the display panel further comprises:
   a base substrate;
   a second conductive layer, located on a side of the base substrate, wherein the second conductive layer comprises first initial signal lines, and the first initial signal lines are configured to provide first initial signals to the pixel-driving circuits; and
   a third conductive layer, located on a side of the second conductive layer distal to the base substrate, wherein the third conductive layer comprises second initial signal lines, and the second initial signal lines are configured to provide second initial signals to the pixel-driving circuits;
   wherein, sheet resistance of a second conductive layer is greater than sheet resistance of the third conductive layer;
   wherein the display panel further comprises an active layer located between the base substrate and the second conductive layer, and the active layer comprises a first active part group, comprising a plurality of first active parts;
   an orthographic projection of at least a part of one of the first initial signal lines on the base substrate extends along a first direction;
   an orthographic projection of at least a part of one of the second initial signal lines on the base substrate extends along a second direction, and the first direction and the second direction intersect;
   the pixel-driving circuit is configured to drive a light-emitting unit to emit light and the pixel-driving circuit further comprises a driving transistor, a second transistor, a sixth transistor and a seventh transistor;
   the second transistor has a first end connected to a gate end of the driving transistor, a second end connected to a first end of the driving transistor, and a gate end connected to a gate-driving signal end;
   the sixth transistor has a first end connected to a first end of the driving transistor, a second end connected to an anode of the light-emitting unit, and a gate end connected to an enable signal end; and
   each of the first active parts comprises:
   a first sub-active part, wherein an orthographic projection of the first sub-active part on the base substrate extends along the first direction, wherein the first sub-active part comprises a first sub-sub-active part configured to form a first channel region of the second transistor; and
   a second sub-active part, connected to the first sub-active part, wherein an orthographic projection of at least a part of the second sub-active part on the base substrate extends along the second direction, wherein the second sub-active part comprises a second sub-sub-active part, configured to form a second channel region of the second transistor, and a part of second sub-active parts are configured to form channel regions of the sixth transistor and the seventh transistor;

wherein, in the same first active part group, orthographic projections of a plurality of first sub-active parts on the base substrate and orthographic projections of a plurality of the second sub-active parts on the base substrate are alternately distributed in sequence in the second direction.

* * * * *